(12) United States Patent
Suh

(10) Patent No.: US 9,209,226 B2
(45) Date of Patent: Dec. 8, 2015

(54) THREE-DIMENSIONAL SEMICONDUCTOR DEVICE AND METHOD OF MANUFACTURING THE SAME

(71) Applicant: SK hynix Inc., Gyeonggi-do (KR)

(72) Inventor: Jun Kyo Suh, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 186 days.

(21) Appl. No.: 14/150,523

(22) Filed: Jan. 8, 2014

(65) Prior Publication Data

US 2015/0060752 A1   Mar. 5, 2015

(30) Foreign Application Priority Data

Sep. 5, 2013   (KR) .......................... 10-2013-0106472

(51) Int. Cl.
| | | |
|---|---|---|
| *H01L 47/00* | (2006.01) | |
| *H01L 27/24* | (2006.01) | |
| *H01L 45/00* | (2006.01) | |
| *H01L 27/22* | (2006.01) | |

(52) U.S. Cl.
CPC .......... *H01L 27/2454* (2013.01); *H01L 27/228* (2013.01); *H01L 45/04* (2013.01); *H01L 45/06* (2013.01); *H01L 45/126* (2013.01); *H01L 45/14* (2013.01); *H01L 45/141* (2013.01); *H01L 45/147* (2013.01); *H01L 45/16* (2013.01); *H01L 45/1683* (2013.01)

(58) Field of Classification Search
CPC .............. H01L 27/2454; H01L 27/228; H01L 27/2427; H01L 45/04; H01L 45/06; H01L 45/126; H01L 45/16; H01L 45/1683
USPC ............................................... 257/4, 330, 331
See application file for complete search history.

(56) References Cited

U.S. PATENT DOCUMENTS 9,029,822 B2 *   5/2015   Satoh .................... H01L 27/228
                                                                257/3

FOREIGN PATENT DOCUMENTS

| KR | 1020080051014 | 6/2008 |
|---|---|---|
| KR | 1020130104527 | 9/2013 |

* cited by examiner

*Primary Examiner* — Tu-Tu Ho
(74) *Attorney, Agent, or Firm* — IP & T Group LLP

(57) ABSTRACT

A 3D semiconductor device and a method of manufacturing the same are provided. The 3D semiconductor device includes a semiconductor substrate, a common source region formed on the semiconductor substrate and extending in a line shape, an active region formed on the common source region and including a lateral channel region, which is substantially in parallel to a surface of the semiconductor substrate, and source and drain regions that are branched from the lateral channel region to a direction substantially perpendicular to the surface of the semiconductor substrate, and a gate formed in a space between the source region and the drain region.

17 Claims, 22 Drawing Sheets

THREE-DIMENSIONAL SEMICONDUCTOR DEVICE AND METHOD OF MANUFACTURING THE SAME

CROSS-REFERENCES TO RELATED APPLICATION

This application claims priority under 35 U.S.C. 119(a) to Korean application No. 10-2013-0106472, filed on Sep. 5, 2013, in the Korean intellectual property Office, which is incorporated by reference in its entirety as set forth in full.

BACKGROUND

1. Technical Field

Various embodiments of the inventive concept relate to a semiconductor integrated circuit device, and more particularly, to a three-dimensional (3D) semiconductor device and a method of manufacturing the same.

2. Related Art

With the rapid development of mobile and digital information communication and the consumer-electronic industry, studies on existing electronic charge controlled-devices may encounter limitations. Thus, new functional memory devices of novel concepts other than the existing electronic charge devices may be developed. In particular, next-generation memory devices with large capacities, ultra-high speed, and ultra-low power may be developed to satisfy demands for large capacity memories of main information apparatuses.

Resistance variable memory devices using a resistance device as a memory medium have been suggested as the next-generation memory devices. Typical examples of resistive variable memory devices are phase-change random access memories (PCRAMs), resistance RAMs (ReRAMs), or magentoresistive RAMs (MRAMs).

A resistive memory device may be formed of a switching device and a resistance device and may store data "0" or "1," according to a state of the resistance device Even in the resistive variable memory devices, the first priority is to improve integration density and to integrate as many memory cells as possible in a limited area.

Currently, methods of forming the resistance variable memory devices in a 3D structure are suggested, and demands for methods of stably stacking a plurality of memory cells with a narrow critical dimension are growing.

As a manufacturing method of a typical 3D structure resistance variable memory device, there is a method for manufacturing a switching device using a vertical pillar. However, the method for manufacturing a switching device using the vertical pillar may have a concern in that a fabrication process of the switching device is complex, and an aspect ratio is increased due to a height of the vertical pillar, and thus the semiconductor device may become structurally unstable.

To overcome this concern of the 3D vertical pillar structure, a 3D lateral channel structure is suggested. The 3D lateral channel structure is a structure in which an active region having a lateral channel (a lateral fin structure or a lateral channel region) in a 3D structure is formed on a semiconductor substrate unlike an existing buried type. In this 3D lateral channel semiconductor device, in general, the lateral fin structure is electrically coupled to the semiconductor substrate through a common source node.

However, a method of supporting a floating lateral channel region through a common source node having a pattern structure may be structurally unstable. Further, since current is transferred through the common source node, current bottleneck may occur.

SUMMARY

According to an exemplary embodiment of the inventive concept, there is provided a 3D semiconductor device. The 3D semiconductor device may include a semiconductor substrate, a common source region formed on the semiconductor substrate and extending in a line shape, an active region formed on the common source region and including a lateral channel region, which is substantially in parallel to a surface of the semiconductor substrate, and source and drain regions that are branched from the lateral channel region to a direction substantially perpendicular to the surface of the semiconductor substrate, and a gate formed in a space between the source region and the drain region.

According to another exemplary embodiment of the inventive concept, there is provided a method of manufacturing a 3D semiconductor device. The method may include forming a line-shaped common source region on a semiconductor substrate, forming an active region including a lateral channel region substantially in parallel to a surface of the semiconductor substrate and source and drain regions branched from the lateral channel region to a direction substantially perpendicular to the surface of the semiconductor substrate, on the line-shaped common source region, and forming a gate in a space between the source region and the drain region.

According to still another exemplary embodiment of the inventive concept, there is provided a 3D semiconductor device. The 3D semiconductor device may include a semiconductor substrate, a common source region formed on the semiconductor substrate and extending in a line shape, an active region supported by the common source region and including a lateral channel region, which is substantially in parallel to a surface of the semiconductor substrate and source and drain regions that are branched from the lateral channel region to a direction substantially perpendicular to the surface of the semiconductor substrate, a gate formed in a space between the source region and the drain region and extending substantially in parallel to the common source region, heating electrodes formed on the source region and the drain region, and resistance variable material layers formed on the heating electrodes, wherein the resistance variable material layer on the drain region may be electrically coupled to the heating electrode therebelow, and the resistance variable material layer on the source region may be electrically isolated from the heating electrode therebelow.

According to still another exemplary embodiment of the inventive concept, a microprocessor is provided. The microprocessor may include a control unit suitable for receiving a signal including a command from the outside and performing extraction or decryption of the command, or input control or output control, an operation unit suitable for performing an operation according to a decryption result of the command in the control unit, and a storage unit suitable for storing one or more among data to be operated, data corresponding to a result of the operation, and an address for the data to be operated. The storage unit may include a transistor including a lateral channel formed on a line-shaped common source region, and a resistance variable material layer electrically coupled to the transistor.

According to still another exemplary embodiment of the inventive concept, a processor is provided. The processor may include a core unit suitable for performing an operation corresponding to a command using a data according to the command input from the outside, a cache semiconductor device unit suitable for storing one or more among data to be operated, data corresponding to a result of the operation, and an address for the data to be operated, and a bus interface suitable for interconnecting the core unit and the cache semiconductor device unit, and transmitting data between the core unit and the cache semiconductor device unit. The cache semiconductor device unit may include a transistor including a lateral channel formed on a line-shaped common source region, and a resistance variable material layer electrically coupled to the transistor.

According to still another exemplary embodiment of the inventive concept, a system is provided. The system may include a processor suitable for interpreting a command input from the outside and controlling an operation of information according to an interpretation result of the command, an auxiliary storage device suitable for storing a program for the interpretation of the command and the information, a main storage device configured to transfer the program and the Information from the auxiliary storage unit and storing the program and the information so that the processor performs the operation using the program and the information when the program is executed, and an interface device suitable for performing communication between the outside and one or more among the processor, the auxiliary storage device, and the main storage device, wherein at least one of the auxiliary storage device and the main storage device may include a transistor including a lateral channel formed on a line-shaped common source region, and a resistance variable material layer electrically coupled to the transistor.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
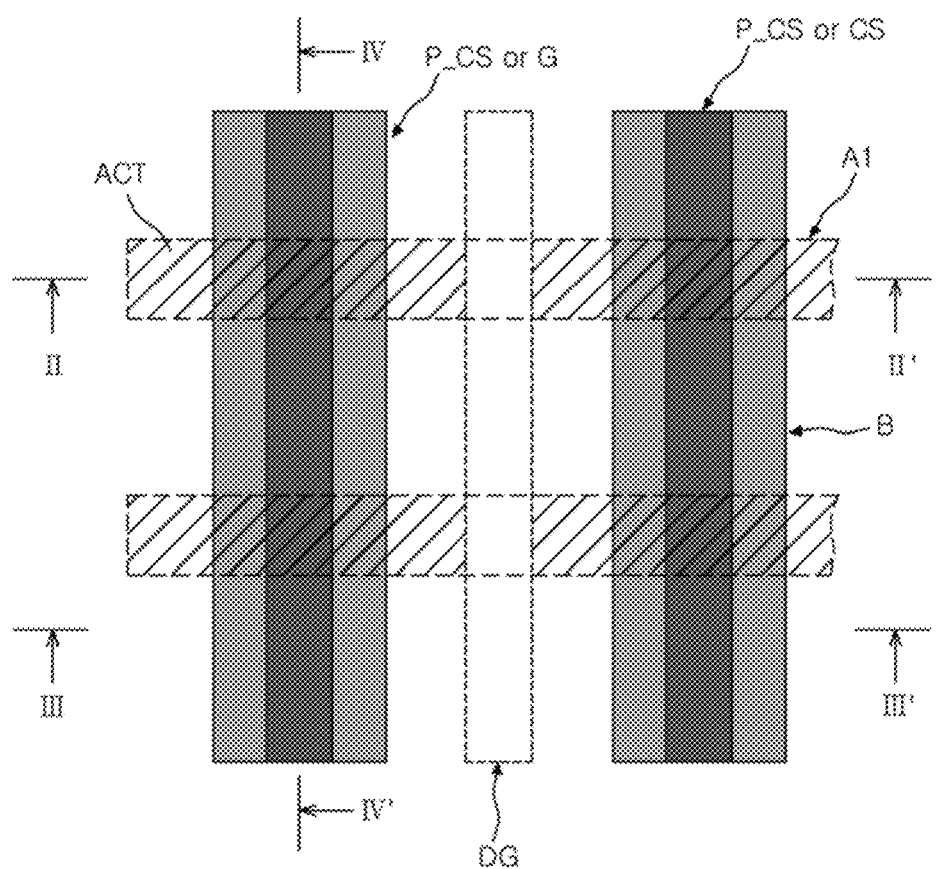
FIG. 1 is a plan view illustrating a 3D semiconductor device according to an embodiment of the inventive concept.

Hereinafter, exemplary embodiments will be described in greater detail with reference to the accompanying drawings. Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present. It is also noted that in this specification, "connected/coupled" refers to one component not only directly coupling another component but also indirectly coupling another component through an intermediate component. In addition, a singular form may include a plural form as long as it is not specifically mentioned in a sentence.

The embodiments of the inventive concept are described herein with reference to cross-section and/or plan illustrations that are schematic illustrations of idealized embodiments of the inventive concept. However, embodiments of the inventive concept should not be construed as limiting to the inventive concept. Although a few embodiments of the inventive concept will be shown and described, it will be appreciated by those of ordinary skill in the art that changes may be made in these exemplary embodiments without departing from the principles and spirit of the inventive concept.

In the embodiment, a resistance variable memory device among semiconductor devices will be described as an example. In the embodiment, a line II-II' of FIG. 1 corresponds to a portion taken along an extending direction of an active region ACT of a semiconductor device, a line III-III' of FIG. 1 corresponds to a portion taken along a space B between active regions ACT, and a line IV-IV' corresponds to a portion taken along an extending direction of a common source region CS.

Referring to FIGS. 1, 2A, 3A, and 4A, a first semiconductor layer 105 and a second semiconductor layer 110 may be sequentially formed on a semiconductor substrate 100. The first semiconductor layer 105 may be a layer for defining a common source region in a subsequent process, and the second semiconductor layer 110 may be a layer for defining an active region in a subsequent process. The first semiconductor layer 105 and the second semiconductor layer 110 may be set by considering thicknesses of the common source region and the active region. The first semiconductor layer 105 and the second semiconductor layer 110 may be formed of materials having etch selectivities different from each other to selectively form the common source region. For example, the first semiconductor layer 105 may include a silicon germanium (SiGe) layer, and the second semiconductor layer 110 may include substantially the same material as that of the semiconductor substrate 100, that is, a silicon material. A first hard mask layer 115 may be formed on the second semiconductor layer 110. The first hard mask layer 115 may include, for example, a material Including a silicon nitride layer.

Referring to FIGS. 1, 2B, 3B, and 4B, other than a portion of the first hard mask layer 115 located in a common source formation region P_CS, the first hard mask layer 115 may be recessed by a predetermined thickness. For example, the recessing process may be performed by forming a mask pattern or a photoresist pattern having different etch selectivity from that of the first hard mask layer 115 on the portion of the first hard mask layer 115 corresponding to the common source formation region P_CS, and by recessing the exposed first hard mask layer 115 by the predetermined thickness. The reference numeral 115a denotes a recessed first hard mask layer. A second hard mask layer 120 may be formed on the first hard mask layer 115a. The second hard mask layer 120 may include a material having different etch selectivity from that of the material of the first hard mask layer 115, and for example, may include a polysilicon layer.

Figure 2A:
FIGS. 2A to 2L are cross-sectional views illustrating a method of manufacturing the 3D semiconductor device taken along line II-II' of FIG. 1.
Figure 2B:
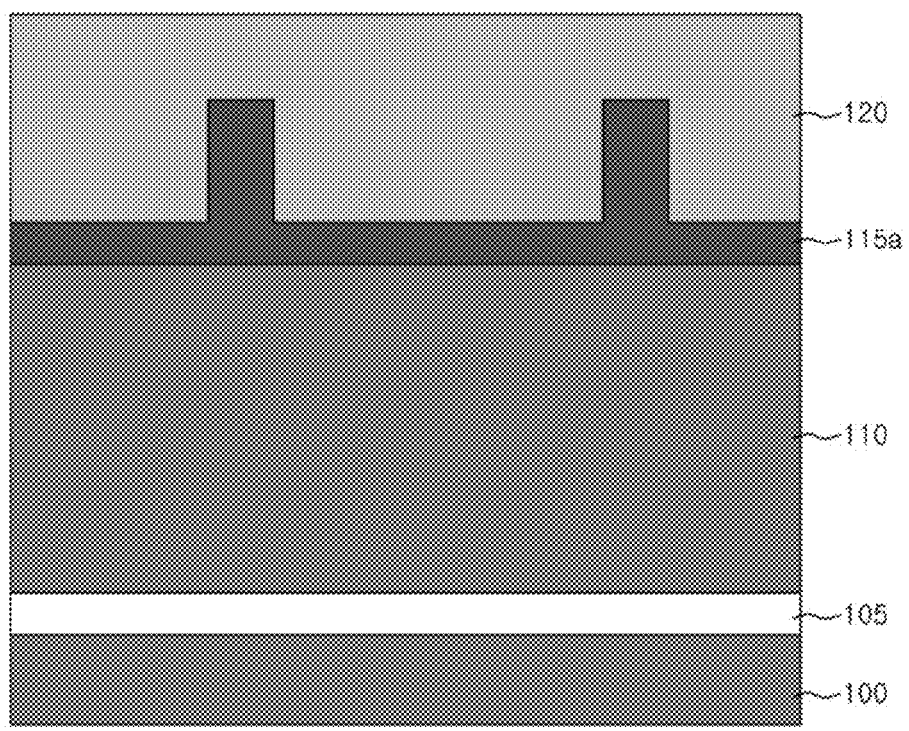
Figure 2C:
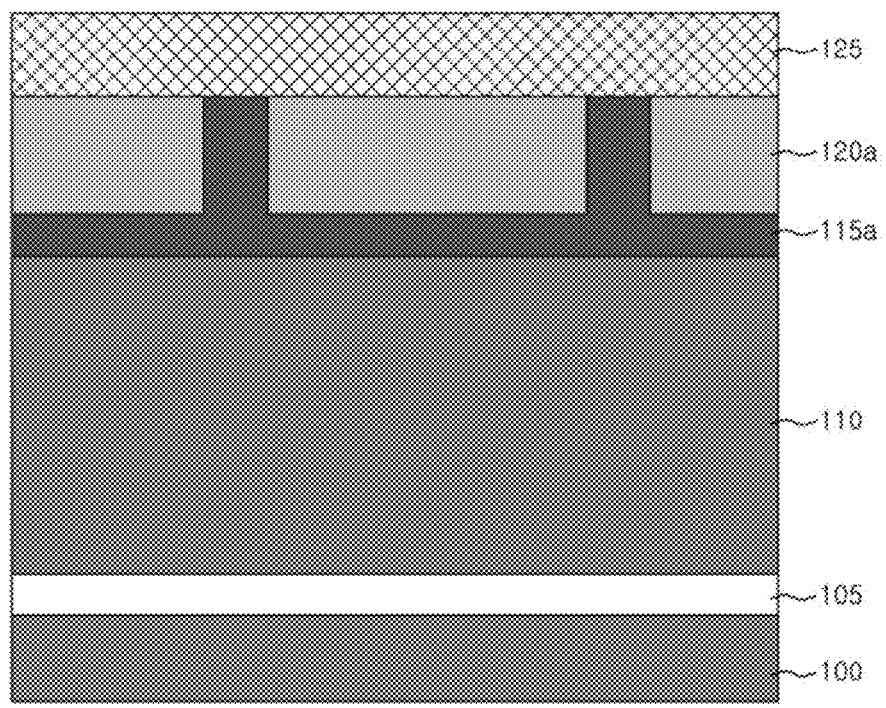
Figure 2D:
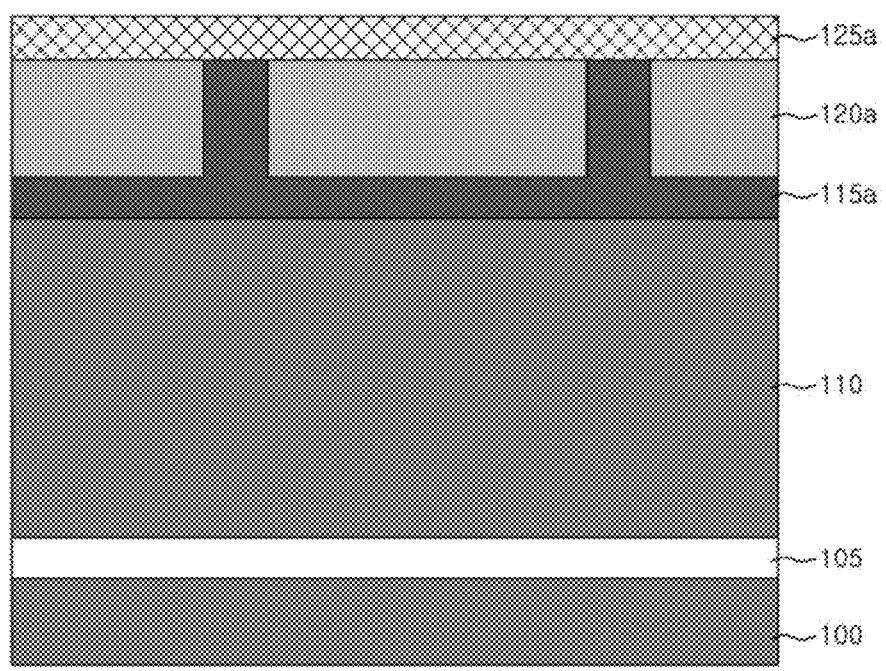
Figure 2E:
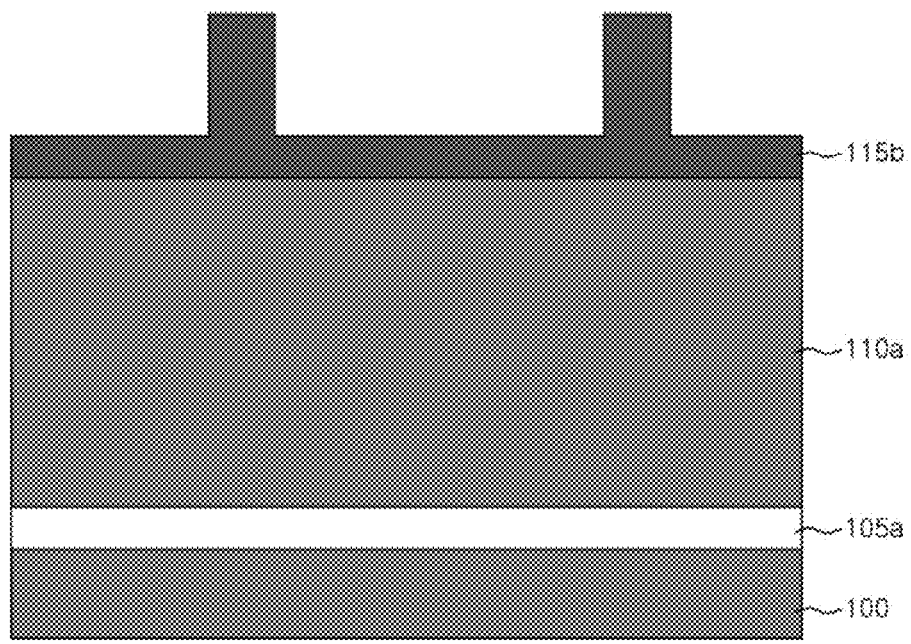
Figure 2F:
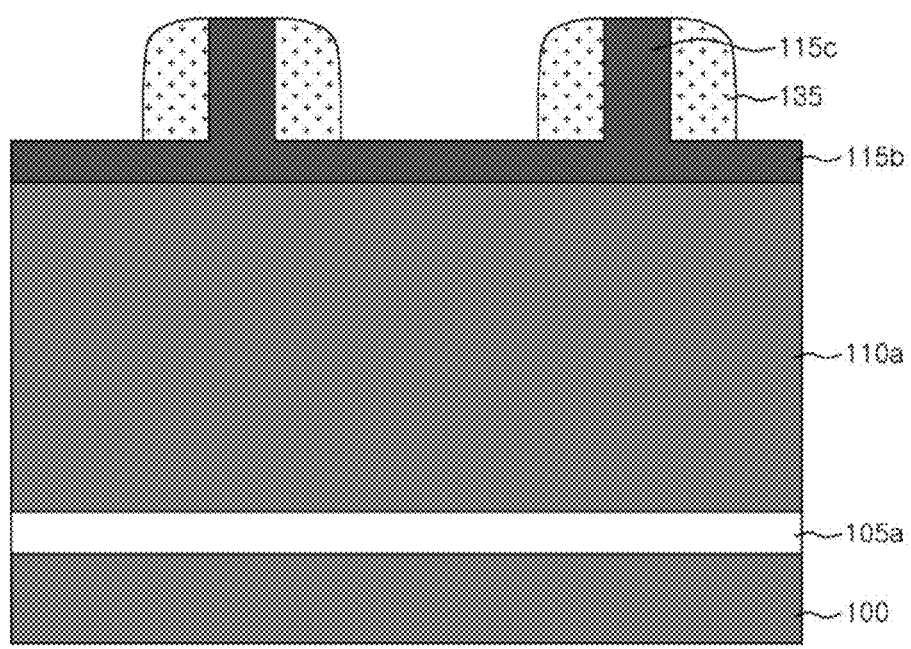
Figure 2G:
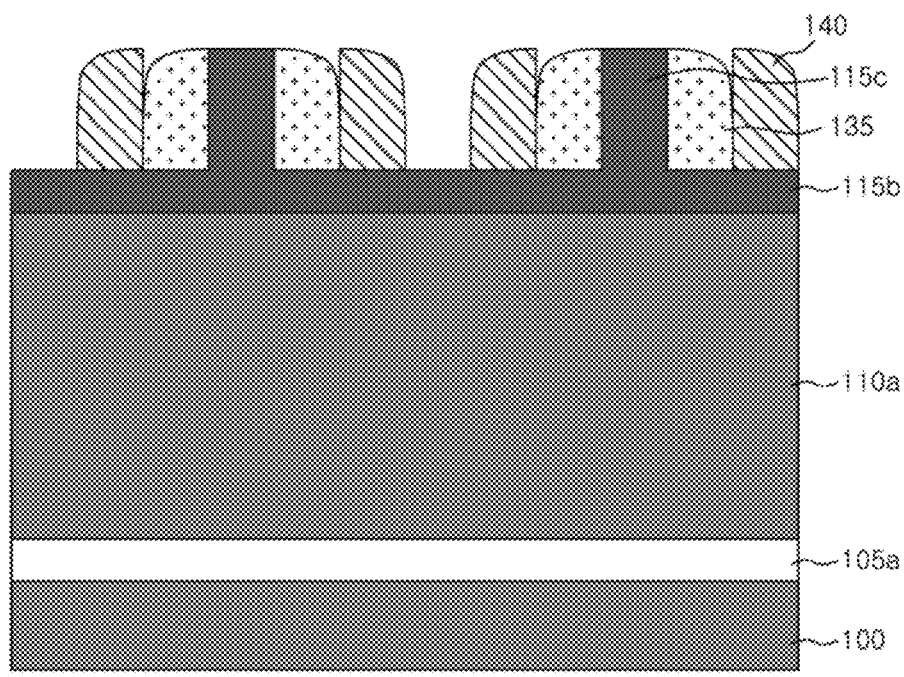
Figure 2H:
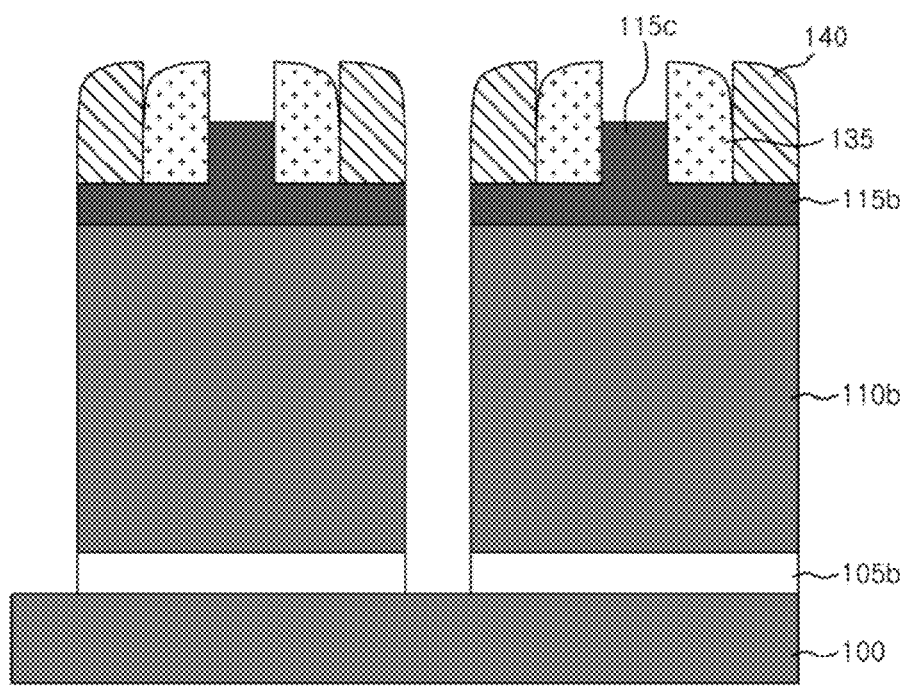
Figure 2I:
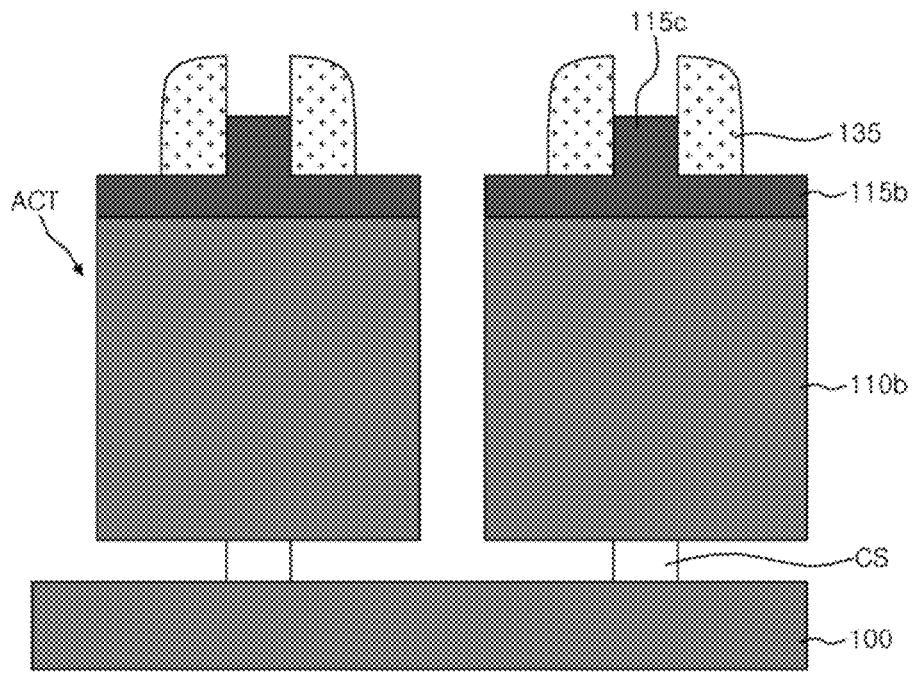
Figure 2J:
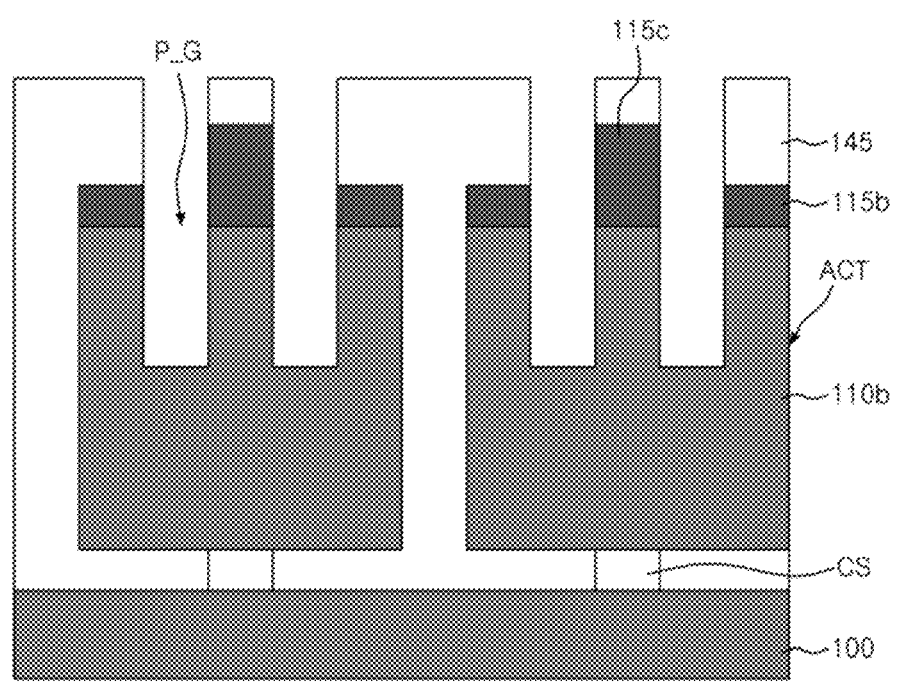
Figure 2K:
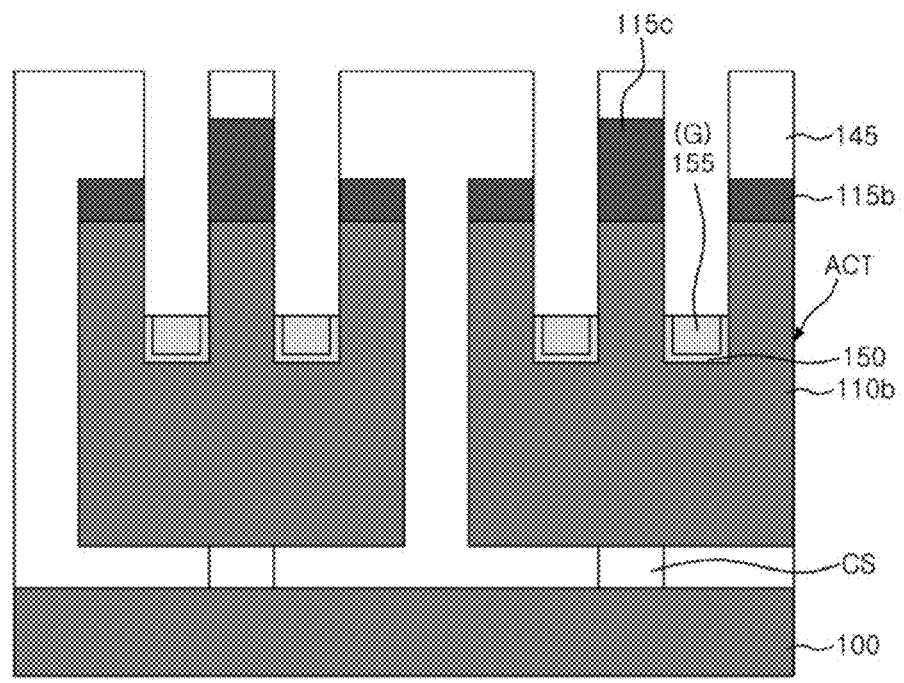
Figure 2L:
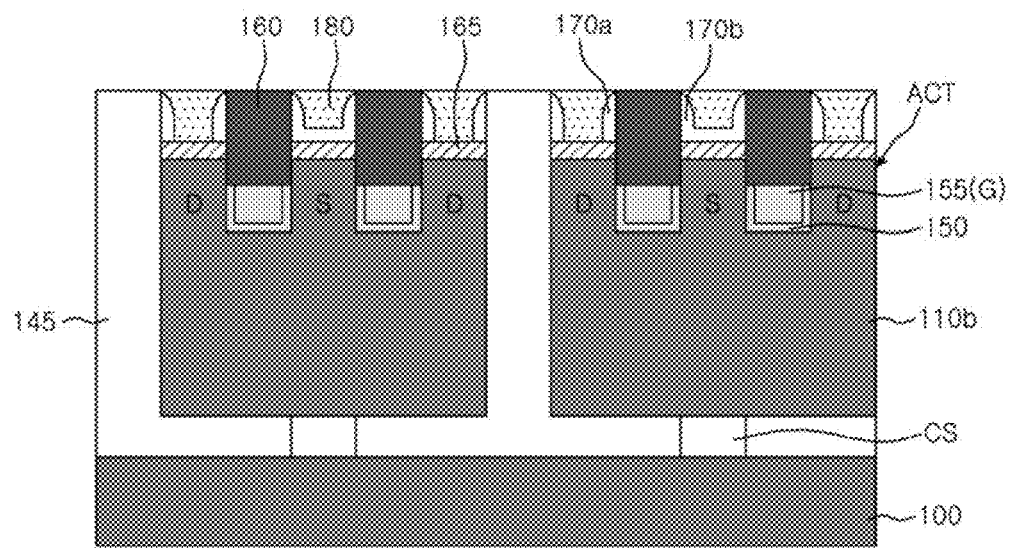
Figure 3A:
FIGS. 3A to 3L are cross-sectional views illustrating a method of manufacturing the 3D semiconductor device taken along line III-III' of FIG. 1.
Figure 3B:
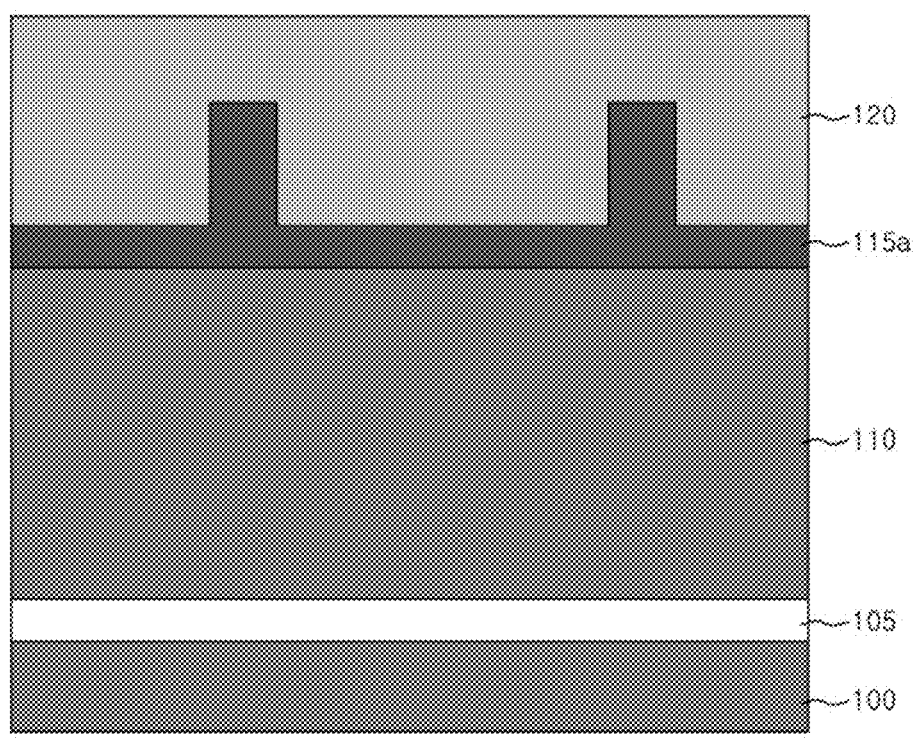
Figure 3C:
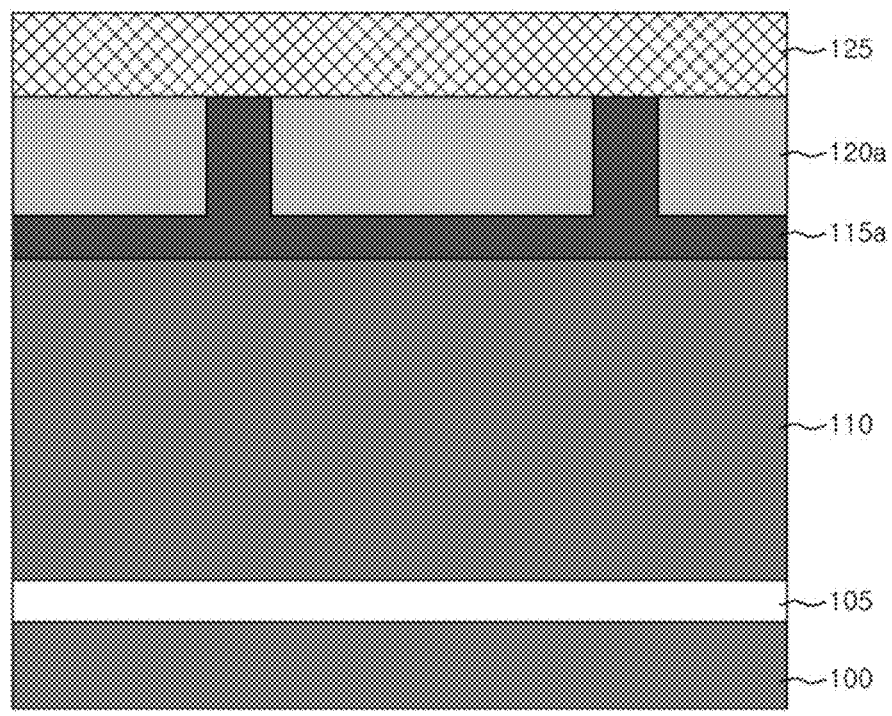
Figure 3D:
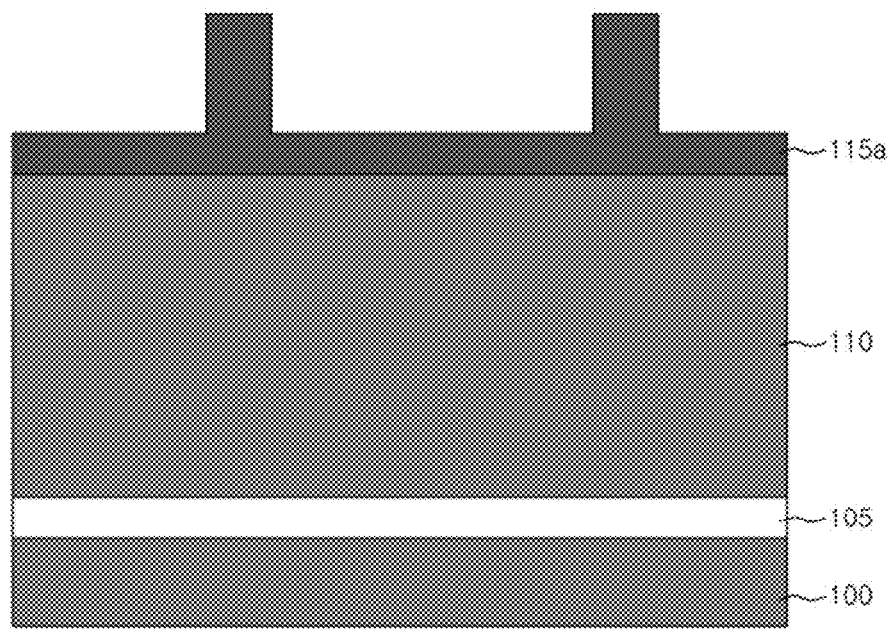
Figure 3E:
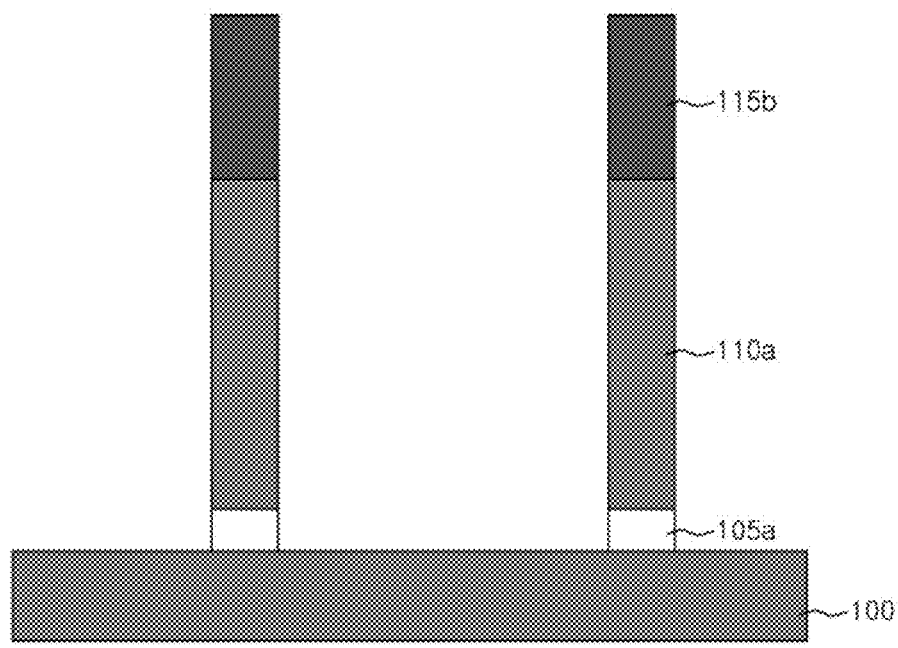
Figure 3F:
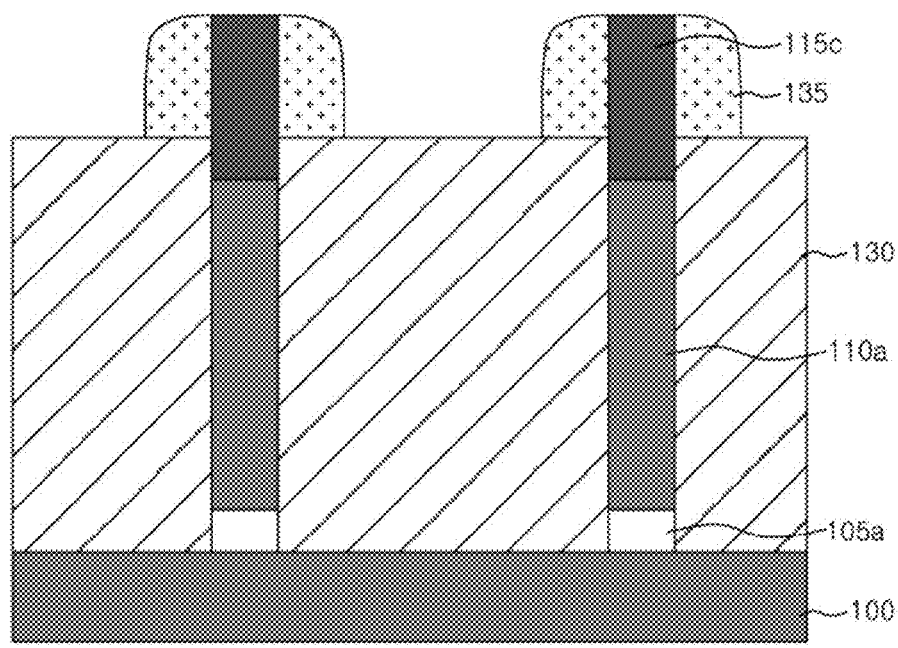
Figure 3G:
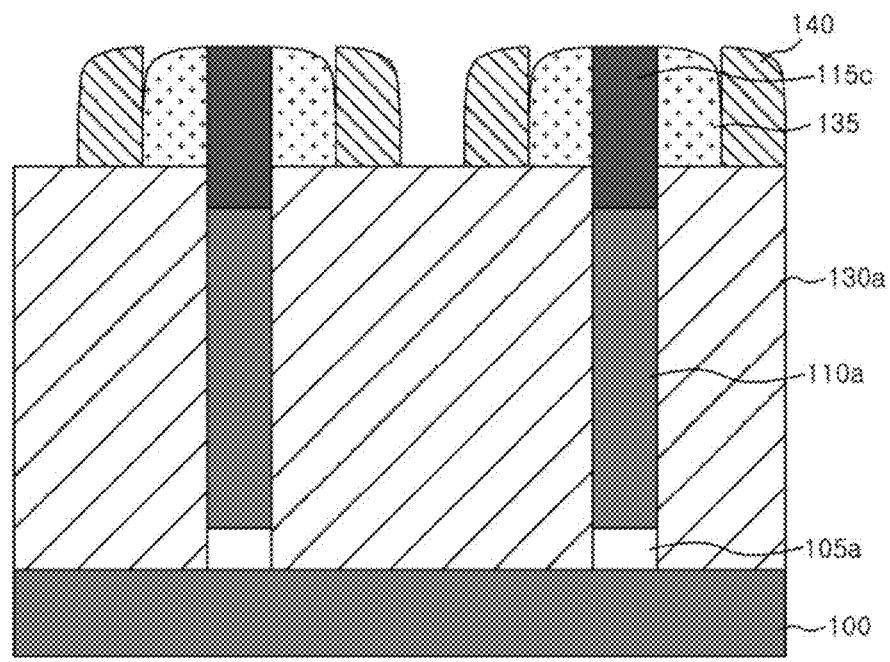
Figure 3H:
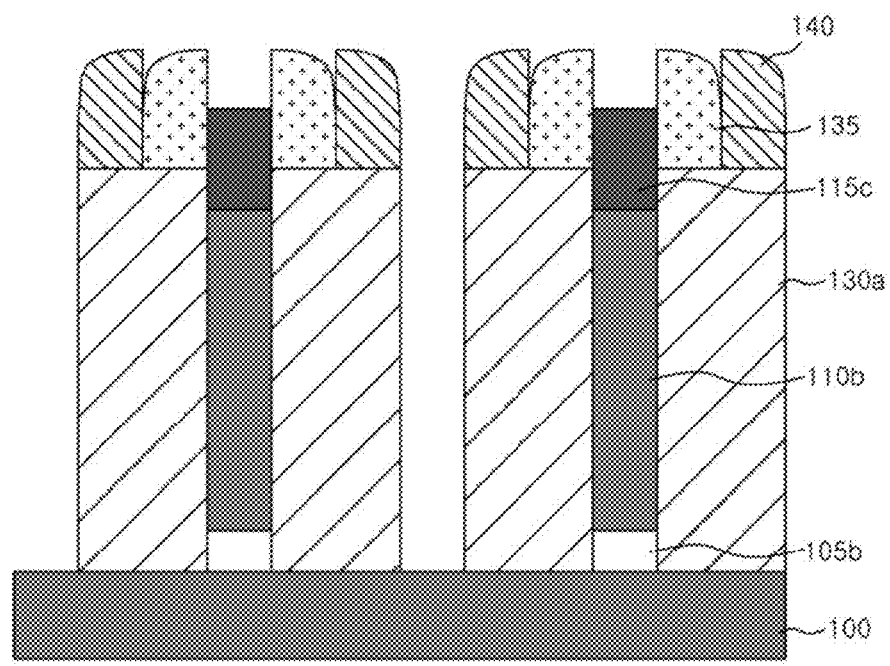
Figure 3I:
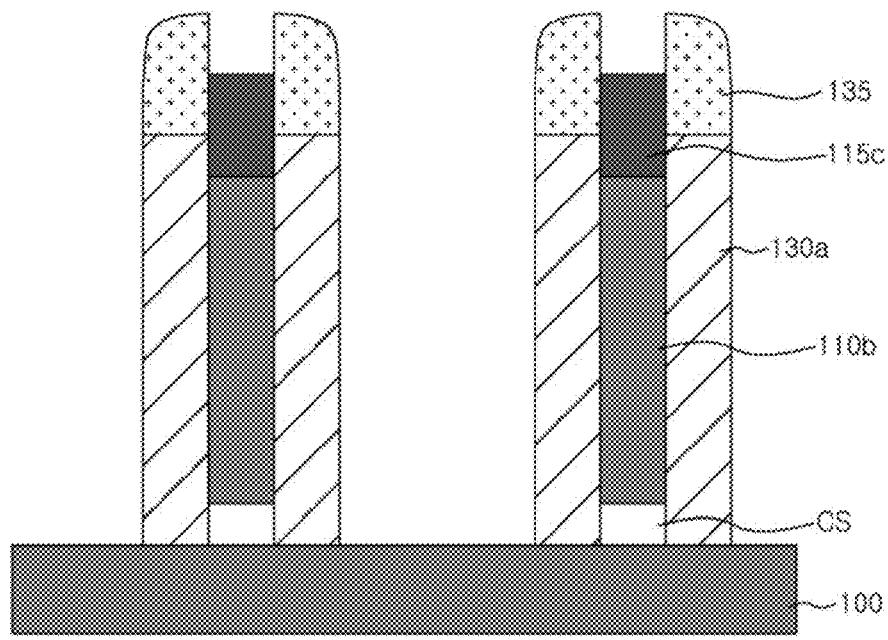
Figure 3J:
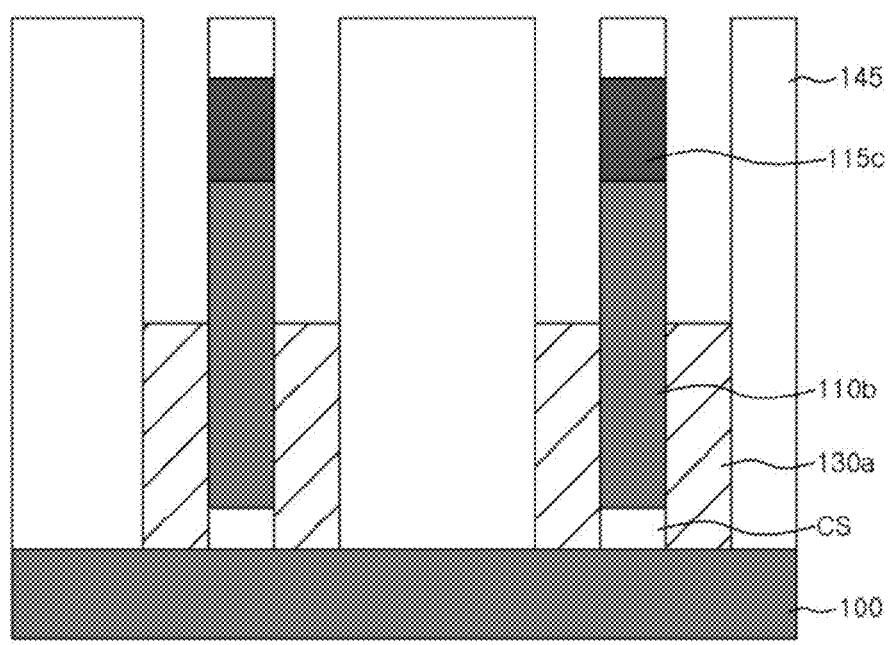
Figure 3K:
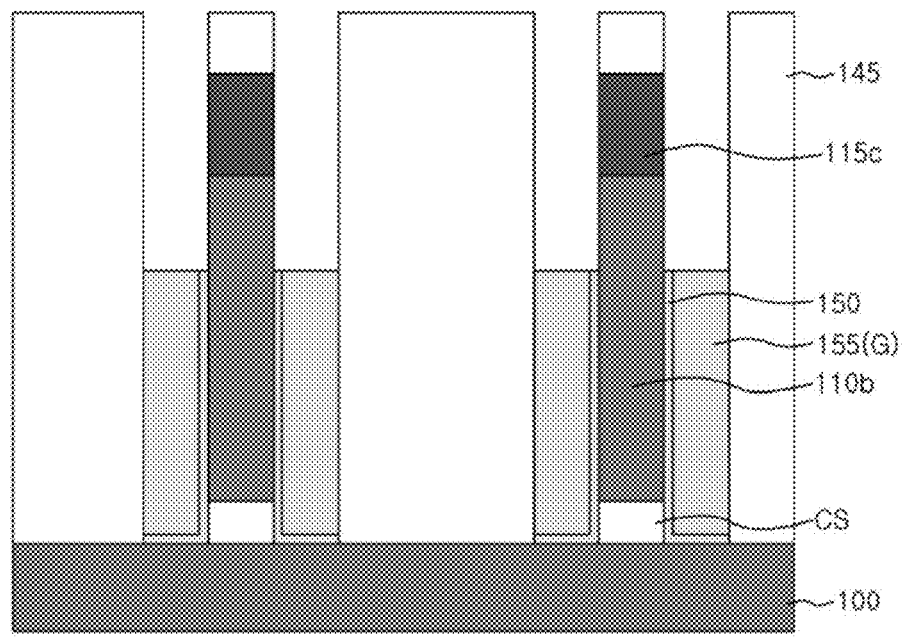
Figure 3L:
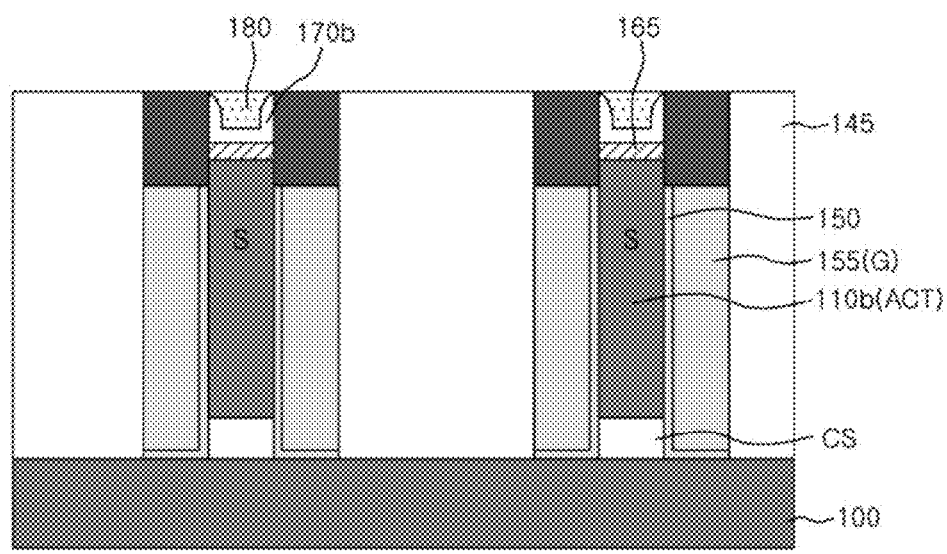
Figure 4A:
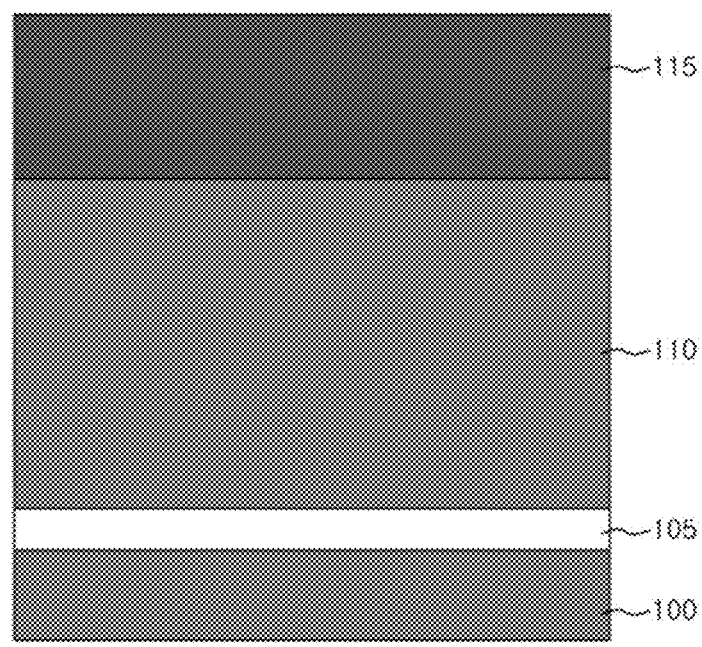
FIGS. 4A to 4L are cross-sectional views illustrating a method of manufacturing the 3D semiconductor device taken along line IV-IV' of FIG. 1.
Figure 4B:
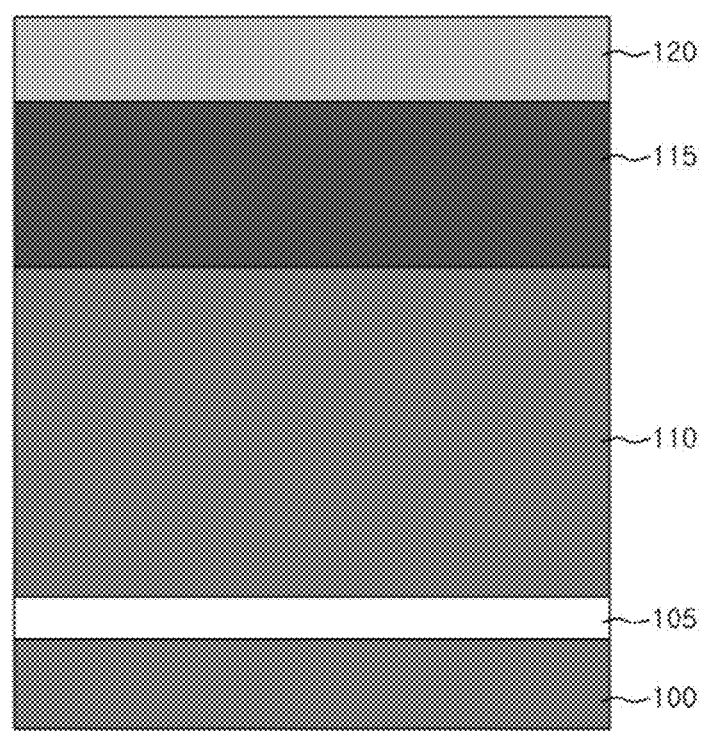
Figure 4C:
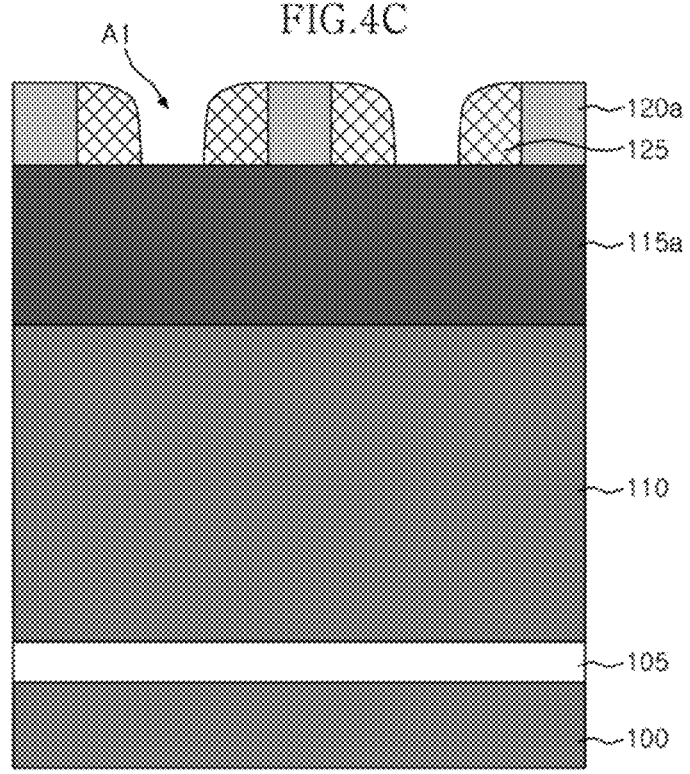
Figure 4D:
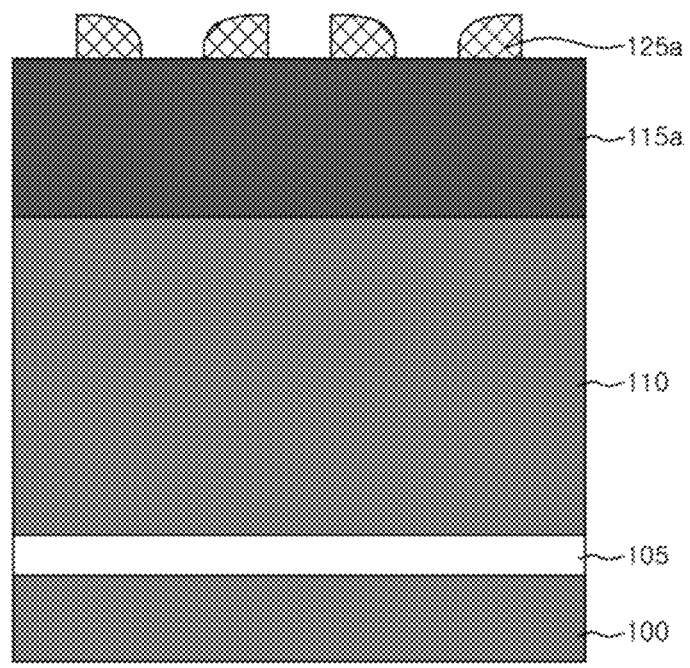
Figure 4E:
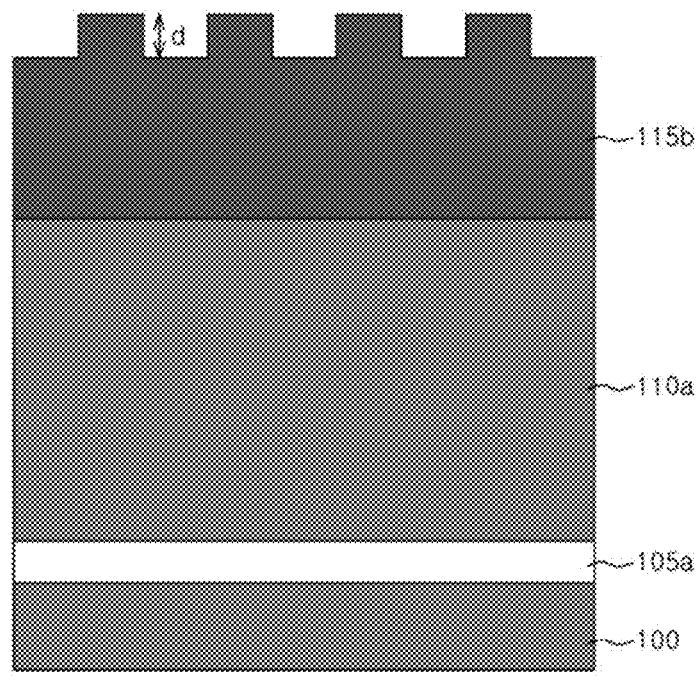
Figure 4F:
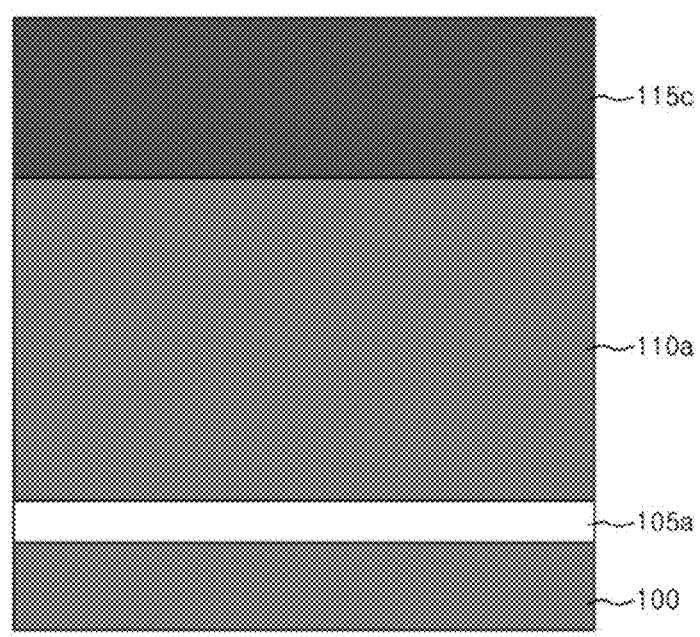
Figure 4G:
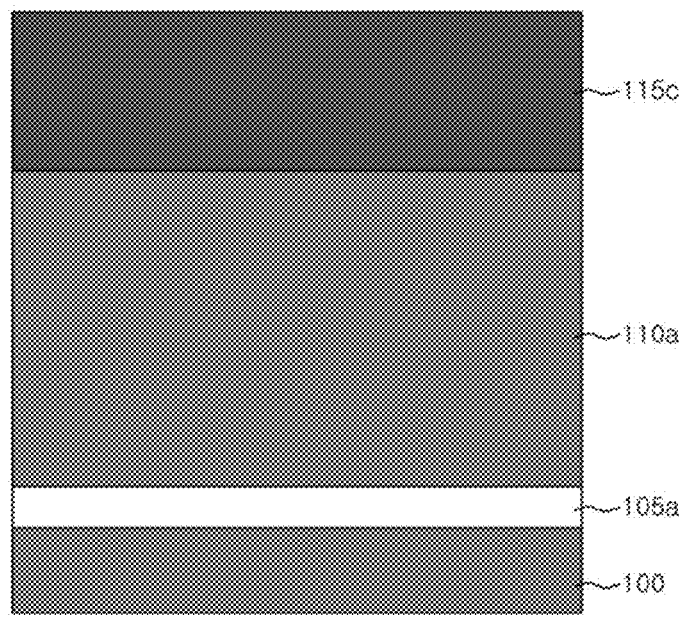
Figure 4H:
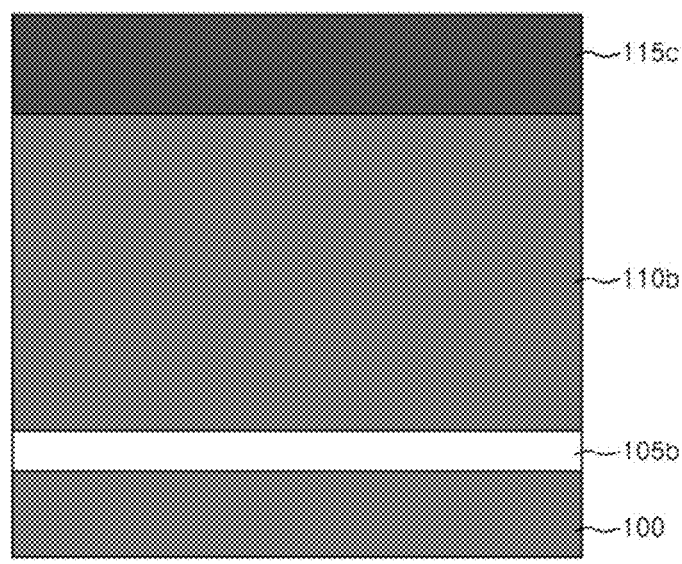
Figure 4I:
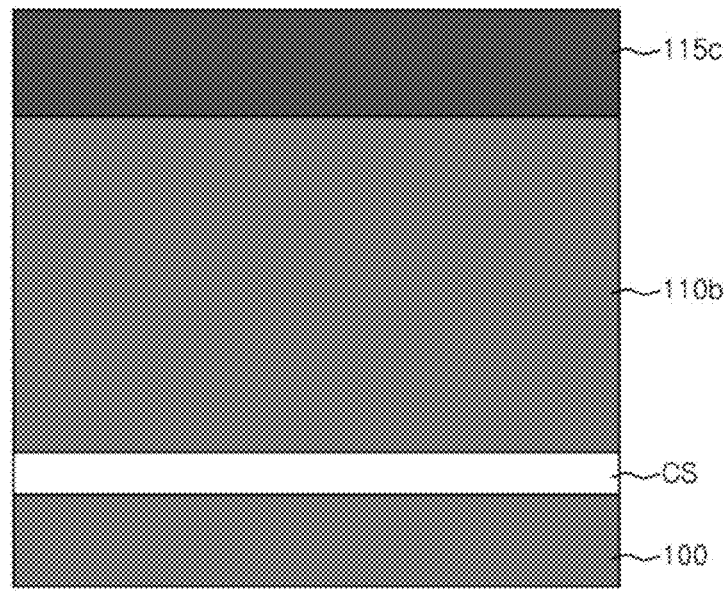
Figure 4J:
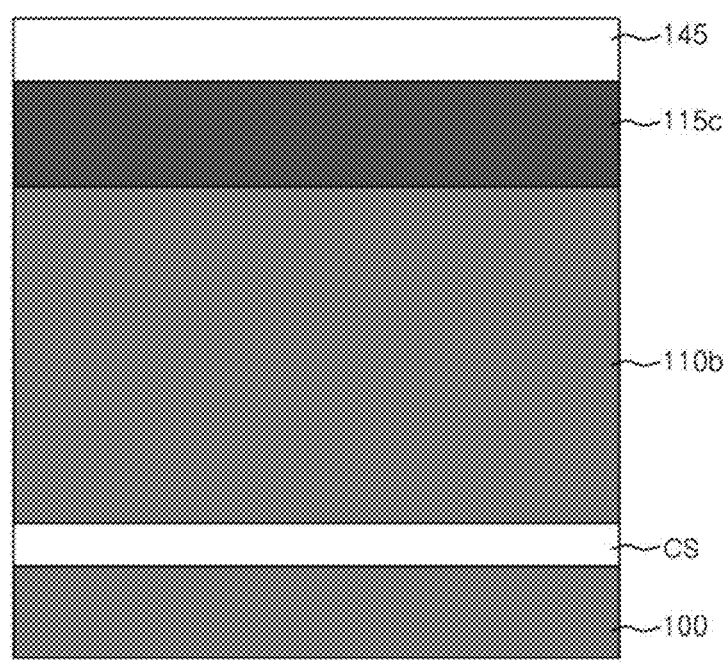
Figure 4K:
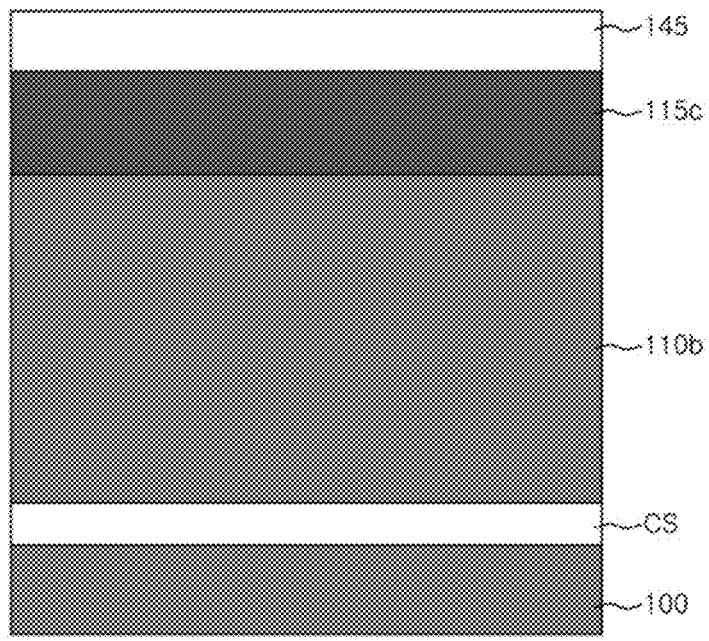
Figure 4L:
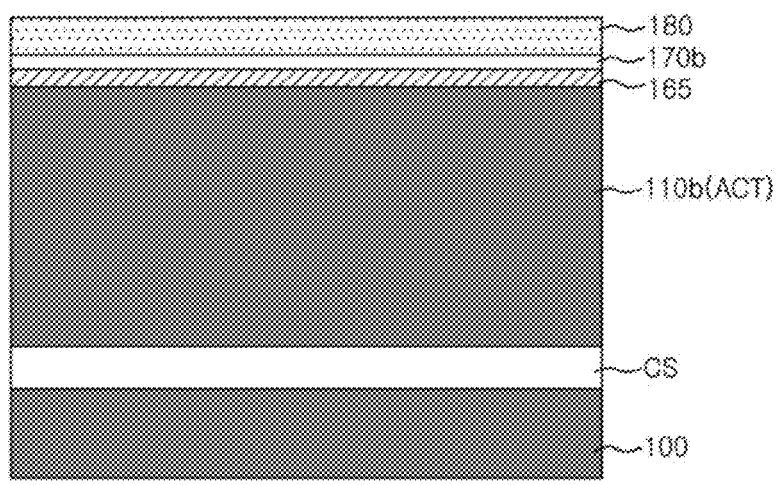

Referring to FIGS. 1, 2C, 3C, and 4C, the second hard mask layer 120 may be recessed by a predetermined thickness to expose the first hard mask layer 115a located on an active formation region A1. The reference numeral 120a denotes a recessed second hard mask layer. For example, as illustrated in FIG. 2C, surfaces of the first and second hard mask layers 115a and 120a may be coplanar on the active formation region A1. As illustrated in FIG. 3C, the first hard mask layer 115a may be covered with the second hard mask layer 120a in the space B between the active formation regions A1. As illustrated in FIG. 4C, a predetermined portion of the first hard mask layer 115a, for example, the active formation region A1, may be exposed in the common source formation region P_CS by the second hard mask layer 120a.

An insulating layer for a spacer is deposited on the second hard mask layer 120a and then anisotropically etched to form a first spacer 125 on a sidewall of the second hard mask layer 120a. The first spacer 125 may be located, for example, in a gate formation region P_G.

Referring to FIGS. 1, 2D, 3D, and 4D, the exposed second hard mask layer 120a may be selectively removed. The first spacer 125 may be recessed by a predetermined thickness. For example, a thickness of the remaining first spacer 125a may be substantially the same as that of the first hard mask layer 115a left in a region other than the common source formation region P_CS.

Referring to FIGS. 1, 2E, 3E, and 4E, the first hard mask layer 115a (shown in FIG. 2D) may be etched using the first spacer 125a as a mask. In the process of etching the first hard mask layer 115a, the first spacer 125a may be removed. Therefore, a predetermined step d may be generated between a portion of the first hard mask layer 115a in which the first spacer 125a has been formed and a portion of the first hard mask layer 115a in which the first spacer 125a has not been formed. Here, the reference numeral 115b denotes the first hard mask layer having the step d. The remaining first hard mask layer 115b may have a form of the active formation region A1.

The second semiconductor layer 110 and the first semiconductor layer 105 are patterned using the first hard mask layer 115b as a mask to form a structure having a form of the active formation region A1. The reference numeral 105a denotes a patterned first semiconductor layer, and 110a denotes a patterned second semiconductor layer.

Referring to FIGS. 1, 2F, 3F, and 4F, a third hard mask layer 130 may be deposited on the semiconductor substrate in which the resulting structure is formed. The third hard mask layer 130 may be formed to have a thickness sufficient to bury the resulting structure. Subsequently, the third hard mask layer 130 may be etched back by a predetermined thickness to have a height lower than that of a portion (hereinafter, a protrusion 115c of the first hard mask layer) of the first hard mask layer 115b located in the common source formation region P_CS. That is, by the formation of the third hard mask layer 130, a top and a side of the protrusion 115c of the first hard mask layer may be exposed. The third hard mask layer 130 may include, for example, a polysilicon layer.

Next, a second spacer 135 may be formed on a sidewall of the protrusion 115c of the first hard mask layer. As known, the second spacer 135 may be formed by depositing a material layer and anisotropically etching the material layer. The material layer for the second spacer 135 may include a material having etch selectivity different from that of the material of the third hard mask layer 130, and for example, may include a titanium metal layer.

Referring to FIGS. 1, 2G, 3G, and 4G, the third hard mask layer 130 may be recessed by a predetermined thickness using the protrusion 115c of the first hard mask layer and the second spacer 135 as a mask. The reference numeral 130a denotes a recessed third hard mask layer. A third spacer 140 may be formed on an outer side of the second spacer 135 through a general process. For example, the third spacer 140 may include a material having etch selectivity different from that of each of the materials of the first and third hard mask layers 115b and 130a and the second spacer 135, and for example, may include an insulating layer.

Referring to FIGS. 1, 2H, 3H, and 4H, the exposed first hard mask layer 115b may be etched using the second spacer 135 and the third spacer 140 as a mask. Therefore, a portion of the first hard mask layer 115b located in the outer side of the third spacer 140 may be removed, and the protrusion 115c of the first hard mask layer having a relatively large thickness may be recessed by a thickness of the first hard mask layer 115b.

The exposed second semiconductor layer 110a and the first semiconductor layer 105a may be patterned using the first hard mask layer 115b, the second spacer 135, and the third spacer 140 as a mask to define active regions ACT. The reference numeral 105b denotes a patterned first semiconductor layer, and the reference numeral 110b denotes a patterned second semiconductor layer.

Referring to FIGS. 1, 2I, 3I, and 4I, the exposed predetermined portion of the first semiconductor layer 105b may be removed to define a common source region CS. For example, the common source region CS may be formed by selectively removing the remaining first semiconductor layer 105b other than a portion of the first semiconductor layer 105b corresponding to the common source formation region P_CS by providing a selective etching medium through a sidewall of the exposed first semiconductor layer 105b. Further, the common source region CS in the embodiment may be implemented in a line shape (see FIG. 4I) other than a node shape in the related art.

The third spacer 140 may be selectively removed through a general method, and the exposed third hard mask layer 130a may be patterned again. Therefore, the third hard mask layer 130a may be left, for example, only below the second spacer 135.

Referring to FIGS. 1, 2J, 3J, and 4J, a gap-fill insulating layer 145 may be formed on the semiconductor substrate 100 including the third hard mask layer 130a. The gap-fill insulating layer 145 may be deposited to sufficiently fill the space between the active regions ACT and then planarized until a surface of the second spacer 135 is exposed.

The exposed second spacer 135 may be selectively removed. Next, the exposed first hard mask layer 115b may be patterned using the gap-fill insulating layer 145 as a mask.

The second semiconductor layer 110b and the third hard mask layer 130a exposed by the gap-fill insulating layer 145 may be etched by a predetermined thickness to define a gate formation region P_G within the second semiconductor layer 110b.

Referring to FIGS. 1, 2K, 3K, and 4K, the remaining third hard mask layer 130a may be removed. Therefore, the gate formation region P_G in the space B between the active regions may have a through-hole shape. Subsequently, a gate insulating layer 150 may be formed on the exposed second semiconductor layer 110b, common source region CS, and semiconductor substrate 100. The gate insulating layer 150 may be formed by oxidizing surfaces of the second semiconductor layer 110b, the common source region CS, and the semiconductor substrate 100 that are formed of a semiconductor material. A conductive layer may be formed in the gate formation region P_G to form a gate 155 (G). The conductive layer for the gate 155 (G) may include, for example, one or more materials selected from the group consisting of doped polysilicon, tungsten (W), copper (Cu), titanium nitride (TIN), tantalum nitride (TaN), tungsten nitride (WN), molybdenum nitride (MoN), niobium nitride (NbN), titanium silicon nitride (TISiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (MoAlN), tantalum silicon nitride (TaSiN), tantalum aluminum nitride (TaAlN), titanium (Ti), molybdenum (Mo), tantalum (Ta), titanium silicide (TiSi), tantalum silicide (TaSi), titanium tungsten (TiW), titanium oxynitride (TiON), titanium aluminum oxynitride (TIAlON), tungsten oxynitride (WON), and tantalum oxynitride (TaON). The gate 155 (G) may be formed by forming the conductive layer to fill the gate formation region P_G and the through hole, and overetching the conductive layer. Therefore, the gate 155 (G) may be formed to have a height lower than the second semiconductor layer 110b, and may be formed in a form to support the common source region CS in the space B between the active regions. At this time, the gate 155 (G) may be insulated from the second semiconductor layer 110b to be used as a channel layer, a source region S, and the semiconductor substrate 100, by the gate insulating layer 150.

Referring to FIGS. 1, 2L, 3L, and 4L, a gate protection layer 160 may be formed to fill the gate formation region P_G on the gate 155(G). The gate protection layer 160 may include, for example, a silicon nitride layer. The gap-fill insulating layer 145, the gate protection layer 160, and the first hard mask layer 115b having the protrusion 115c may be planarized to expose a surface of the second semiconductor layer 110b, that is, a surface of the active region ACT. Therefore, source and drain formation regions may be defined at both sides of the gate 155 and the gate protection layer 166.

The exposed source and drain formation regions may be etched by a predetermined depth to define variable resistor regions. Impurities may be implanted into the second semiconductor layer 110b exposed through the variable resistor regions, that is, the active region ACT to form source and drain regions S and D. The source and drain regions S and D may be formed so that two drain regions D share one source region S.

Heating electrodes 165 may be formed on the variable resistor regions on the source and drain regions S and D. The heating electrodes may be formed by forming a conductive layer to bury the variable resistor regions, and recessing the conductive layer to remain in a lower portion of the variable resistor regions.

An insulating layer for a resistor spacer may be deposited on the semiconductor substrate in which the heating electrodes 165 are formed. The insulating layer for a resistor spacer may include a material having good heat endurance, and for example, may include a silicon nitride layer. A mask pattern (not shown) may be formed to shield the insulating layer for a resistor spacer on the source region S. The exposed insulating layer for a resistor spacer may be etched using a general spacer etching process, for example, an anisotropic etching process to form a resistor spacer 170a on a sidewall of the variable resistor region on the drain region D. At this time, a portion of the heating electrode 165 on the drain region D may be exposed by the resistor spacer 170a.

The insulating layer 170b for a resistor spacer on the source region S may be shield by the mask pattern and thus may not be etched in the spacer etching process. Therefore, the heating electrode 165 on the source region S may be covered with the insulating layer 170b for a resistor spacer. Even when the heating electrode 165 is formed on the source region S, the heating electrode 165 located on the source region S may not serve as a substantial heating electrode since the heating electrode 165 located on the source region S is shielded by the insulating layer 170b for a resistor spacer. Next, the mask pattern may be removed through a general process.

Resistance variable material layers 180 may be formed to bury the variable resistor regions. The resistance variable material layer 180 may include a PCMO layer for a ReRAM, a chalcogenide layer for a PCRAM, a magnetic layer for a MRAM, a magnetization reversal device layer for a spin-transfer torque magnetoresistive RAM (STTMRAM), or a polymer layer for a polymer RAM (PoRAM).

The resistance variable material layer 180 on the drain region D may be electrically coupled to the heating electrode 165 so that a resistance of the resistance variable material layer 180 may be changed according to a current or a voltage provided from the heating electrode 165. The resistance variable material layer 180 on the source region S may be electrically isolated from the heating electrode 165 by the insulating layer 170b for a resistor spacer so that a resistance of the resistance variable material layer 180 may not be changed.

Subsequently, although not shown, a bit line may be formed on the resistance variable material layer 180. The bit line may be formed in a direction substantially perpendicular to an extending direction of the gate 155.

In the embodiment, although a dummy gate DG may be formed between active regions ACT horizontally located in a row as illustrated in FIG. 1, for clarity, a process for manufacturing the dummy gate DG will be omitted.

According to the 3D semiconductor device having the lateral channel structure of the embodiment, a source node for supporting an active region is formed in a line shape. Therefore, since a common source region is formed not in a node structure or a pattern structure but in a line shape occupying a certain area, the source node may stably support the active region. Accordingly, the structural issue such as leaning may be improved.

Further, since the common source region in the embodiment may be arranged substantially in parallel to a gate, with a gate insulating layer interposed therebetween, the common source region may be additionally supported by the gate, thereby stably forming the 3D semiconductor device.

As the source region is changed from an existing pattern structure to the line shape, a current discharging area may also be increased to improve electrical Interaction characteristics.

Figure 5:
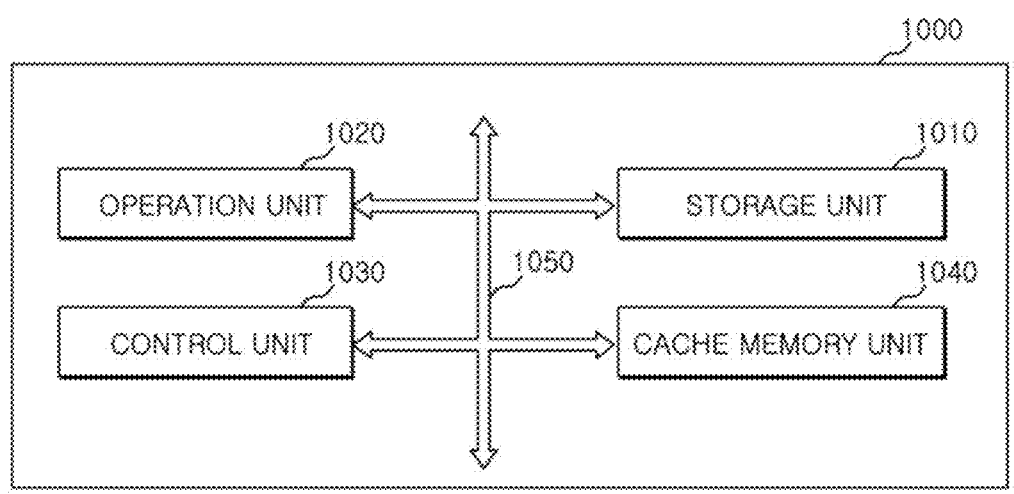
FIG. 5 is a block diagram illustrating a microprocessor according to an embodiment of the inventive concept.

As illustrated in FIG. 5, a microprocessor 1000 to which the semiconductor device according to the embodiment is applied may control and adjust a series of processes, which receive data from various external apparatuses, process the data, and transmit processing results to the external apparatuses. The microprocessor 1000 may include a storage unit 1010, an operation unit 1020, and a control unit 1030. The microprocessor 1000 may be a variety of processing apparatuses, such as a central processing unit (CPU), a graphic processing unit (GPU), a digital signal processor (DSP), or an application processor (AP).

The storage unit 1010 may be a processor register or a register, and the storage unit may be a unit that may store data in the microprocessor 1000 and include a data register, an address register, and a floating point register. The storage unit

1010 may include various registers other than the above-described registers. The storage unit 1010 may temporarily store data to be operated in the operation unit 1020, resulting data processed in the operation unit 1020, and an address in which the data to be operated is stored.

The storage unit 1010 may include one of the semiconductor devices according to embodiments. The storage unit 1010 including the semiconductor device according to the above-described embodiment may include a 3D semiconductor device including a lateral channel structure in which an active region is supported by a line-shaped common source region.

The operation unit 1020 may be a unit that may perform an operation in the microprocessor 1000, and may perform a variety of four fundamental rules of an arithmetic operation or logic operations depending on a decryption result of a command in the control unit 1030. The operation unit 1020 may include one or more arithmetic and logic units (ALUs).

The control unit 1030 may receive a signal from the storage unit 1010, the operation unit 1020, or an external apparatus of the microprocessor 1000, may perform extraction or decryption of a command, or input or output control, and may execute a process in a program form.

The microprocessor 1000 according to the embodiment may further include a cache memory unit 1040 that may temporarily store data input from an external apparatus or data to be output to an external apparatus, other than the memory unit 1010. At this time, the cache memory unit 1040 may exchange data with the storage unit 1010, the operation unit 1020, and the control unit 1030 through a bus interface 1050.

Figure 6:
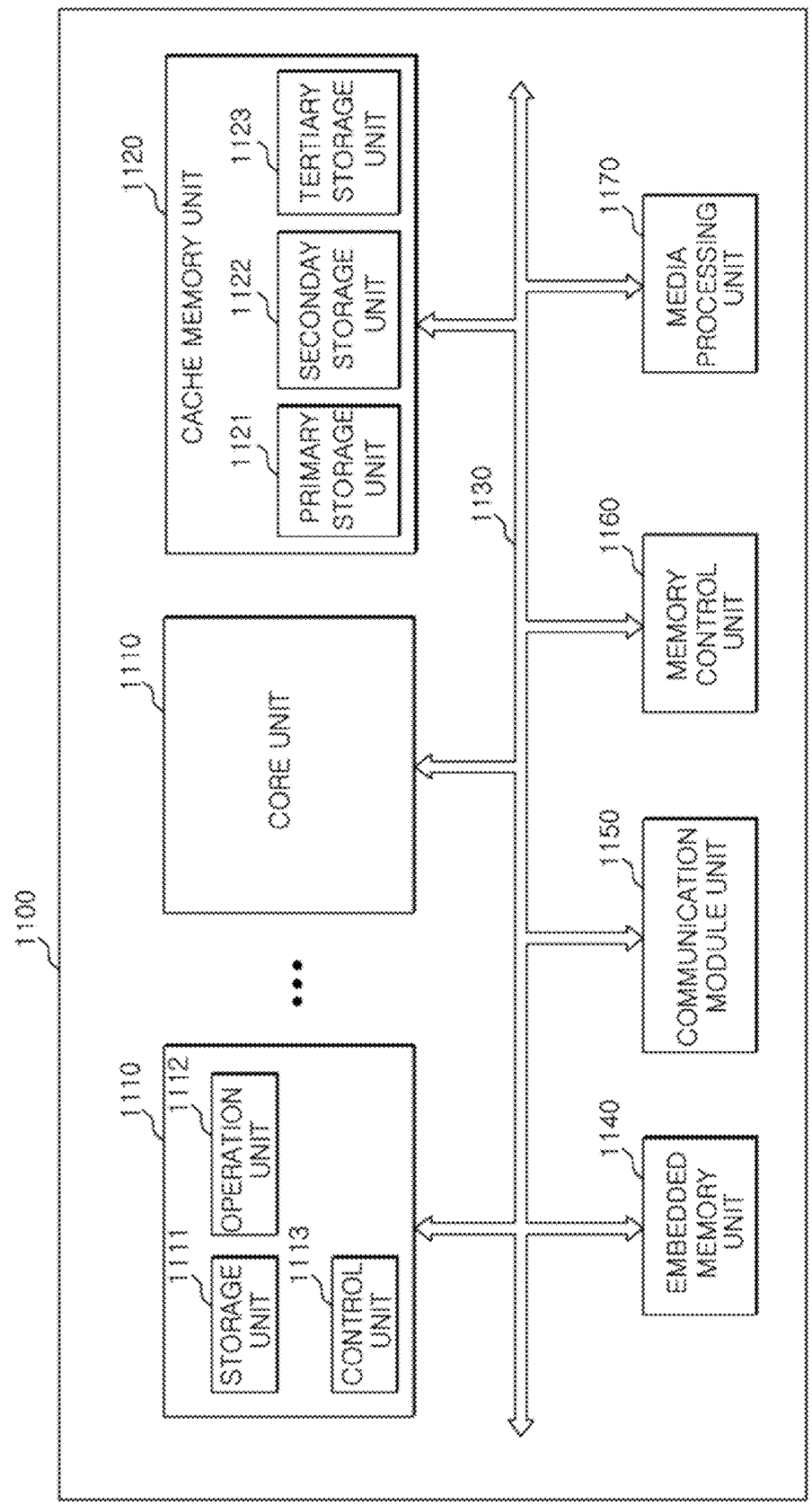
FIG. 6 is a block diagram illustrating a processor according to an embodiment of the inventive concept.

As illustrated in FIG. 6, a processor 1100 according to the embodiment may include various functions to implement performance improvement and multifunction in addition to the functions of the microprocessor that may control and adjust a series of processes, which receive data from various external apparatuses, process the data, and transmit processing results to the external apparatuses. The processor 1100 may include a core unit 1110, a cache memory unit 1120, and a bus interface 1130. The core unit 1110 in the embodiment may be a unit that may perform arithmetic and logic operations on data input from an external apparatus, and include a storage unit 1111, an operation unit 1112, and a control unit 1113. The processor 1100 may be a variety of system on chips (SoCs) such as a multi core processor (MCP), a GPU, or an AP.

The storage unit 1111 may be a processor register or a register, and the storage unit 1111 may be a unit that may store data in the processor 1100 and include a data register, an address register, and a floating point register. The storage unit 1111 may include various registers other than the above-described registers. The storage unit 1111 may temporarily store data to be operated in the operation unit 1112, resulting data processed in the operation unit 1112, and an address in which the data to be operated is stored. The operation unit 1112 may be a unit that may perform an operation in the processor 1100, and perform a variety of four fundamental rules of an arithmetic operation or logic operations depending on a decryption result of a command in the control unit 1113. The operation unit 1112 may include one or more arithmetic and logic units (ALUs). The control unit 1113 receives a signal from the storage unit 1111, the operation unit 1112, or an external apparatus of the processor 1100, performs extraction or decryption of a command, or input or output control, and executes a process in a program form.

The cache memory unit 1120 may be a unit that may temporarily store data to supplement a data processing rate of a low speed external apparatus unlike the high speed core unit 1110. The cache memory unit 1120 may include a primary storage unit 1121, a secondary storage unit 1122, and a tertiary storage unit 1123. In general, the cache memory unit 1120 may include the primary and secondary storage units 1121 and 1122. When a high capacity storage unit is necessary, the cache memory unit 1120 may include the tertiary storage unit 1123. If necessary, the cache memory 1120 may include more storage units. That is, the number of storage units included in the cache memory unit 1120 may be changed according to design. Here, processing rates of data storage and discrimination of the primary, secondary, and tertiary storage units 1121, 1122, and 1123 may be the same as or different from each other. When the processing rates of the storage units are different, the processing rate of the primary storage unit is the greatest. One or more of the primary storage unit 1121, the secondary storage unit 1122, and the tertiary storage unit 1123 in the cache memory unit 1200 may include one of the semiconductor devices according to embodiments. The cache memory unit 1120 including the semiconductor device according to the above-described embodiment may include a 3D semiconductor device including a lateral channel structure in which an active region is supported by a line-shaped common source region. FIG. 6 has illustrated that all of the primary, secondary, tertiary storage units 1121, 1122, and 1123 are disposed in the cache memory unit 1120. However, all of the primary, secondary, tertiary storage units 1121, 1122, and 1123 in the cache memory unit 1120 may be disposed outside the core unit 1110, and may supplement a difference between the processing rates of the core unit 1110 and an external apparatus. Further, the primary storage unit 1121 of the cache memory unit 1120 may be located in the core unit 1110, and the secondary storage unit 1122 and the tertiary storage unit 1123 may be located outside the core unit 1110 to enforce a function to compensate a processing rate.

The bus interface 1130 may be a unit that may couple the core unit 1110 and the cache memory unit 1120 to efficiently transmit data.

The processor 1100 according to the embodiment may include a plurality of core units 1110, and the core units 1110 may share the cache memory unit 1120. The core units 1110 and the cache memory unit 1120 may be coupled through the bus interface 1130. The core units 1110 may have the same configuration as the configuration of the above-described core unit 1110. When the core units 1110 are provided, the primary storage unit 1121 of the cache memory unit 1120 may be disposed in each of the core units 1110 corresponding to the number of core units 1110, and one secondary storage unit 1122 and one tertiary storage unit 1123 may be disposed outside the core units 1110 so that the core units share the secondary and tertiary storage units through the bus interface 1130. Here, the processing rate of the primary storage unit 1121 may be greater than that of each of the secondary and tertiary storage units 1122 and 1123.

The processor 1100 according to the embodiment may further include an embedded memory unit 1140 that may store data, a communication module unit 1150 that may transmit data to and receive data from an external apparatus in a wired manner or a wireless manner, a memory control unit 1160 that may drive an external storage device, and a media processing unit 1170 that may process data processed in the processor 1100 or data input from an external apparatus and may output a processing result to an external Interface device. The processor may further include a plurality of modules. At this time, the modules may transmit data to and receive data from the core unit 1110 and the cache memory unit 1120, and transmits and receive data between the modules, through the bus interface 1130.

The embedded memory unit 1140 may include a volatile memory or a nonvolatile memory. The volatile memory may include a dynamic random access memory (DRAM), a mobile DRAM, a static random access memory (SRAM), or the like, and the nonvolatile memory may include a read only memory (ROM), a NOR flash memory, a NAND flash memory, a phase-change random access memory (PRAM), a resistive RAM (RRAM), a spin transfer torque RAM (STTRAM), a magnetic RAM (MRAM), or the like. The semiconductor device according to the embodiment may be applied to the embedded memory unit 1140.

The communication module unit 1150 may include all modules such as a module coupled to a wired network and a module coupled to a wireless network. The wired network module may include a local area network (LAN), a universal serial bus (USB), Ethernet, a power line communication (PLC), or the like, and the wireless network module may include Infrared Data Association (IrDA), Code Division Multiple Access (CDMA), Time Division Multiple Access (TDMA), Frequency Division Multiple Access (FDMA), a wireless LAN, Zigbee, a Ubiquitous Sensor Network (USN), Bluetooth, Radio Frequency Identification (RFID), Long Term Evolution (LTE), Near Field Communication (NFC), Wireless Broadband Internet (Wibro), High Speed Downlink Packet Access (HSDPA), Wideband CDMA (WCDMA), Ultra WideBand (UWB), or the like.

The memory control unit 1160 may be a unit that may manage data transmitted between the processor 1100 and an external apparatus, and may operate according to a different communication standard from the processor 1100. The memory control unit 1160 may include a variety of memory controllers, or a controller that may control Integrated Device Electronics (IDE), Serial Advanced Technology Attachment (SATA), a Small Computer System Interface (SCSI), a Redundant Array of Independent Disks (RAID), a solid state disk (SSD), External SATA (eSATA), Personal Computer Memory Card International Association (PCMCIA), a USB, a secure digital (SD) card, a mini secure digital (mSD) card, a micro SD card, a secure digital high capacity (SDHC) card, a memory stick card, a smart media (SM) card, a multimedia card (MMC), an embedded MMC (eMMC), a compact flash (CF) card, or the like.

The media processing unit 1170 may be a unit that may process data processed in the processor 1100 or data input from an external input device, and may output a processing result to an external interface device so that the processing result may be transferred in video, sound, or other types. The media processing unit 1170 may include a GPU, a DSP, a HD audio, a high definition multimedia interface (HDMI) controller, or the like.

Figure 7:
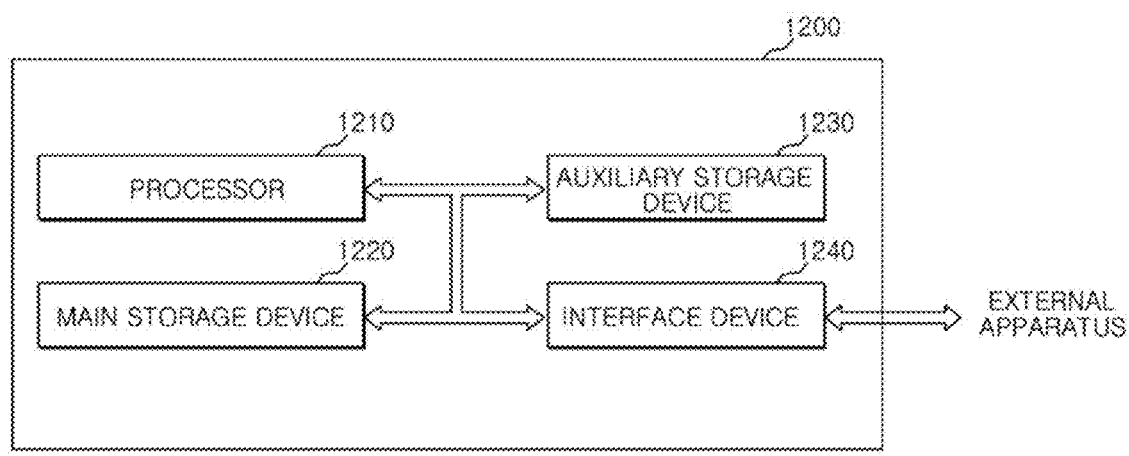
FIG. 7 is a block diagram illustrating a system according to an embodiment of the inventive concept.

As illustrated in FIG. 7, a system 1200 to which the semiconductor device according to an embodiment of the inventive concept is applied is a data processing apparatus. The system 1200 may perform input, processing, output, communication, storage, and the like to perform a series of operations on data, and include a processor 1210, a main storage device 1220, an auxiliary storage device 1230, and an interface device 1240. The system according to the embodiment may be a variety of electronic systems that may operate using a processor, such as a computer, a server, a personal digital assistant (PDA), a portable computer, a web tablet, a wireless phone, a mobile phone, a smart phone, a digital music player, a portable multimedia player (PMP), a camera, a global positioning system (GPS), a video camera, a voice recorder, Telematics, an audio visual (AV) system, or a smart television.

The processor 1210 is a core configuration of the system that may control interpretation of an input command and processing such as an operation, comparison, and the like of data stored in the system. The processor 1210 may include a MPU, a CPU, a single/multi core processor, a GPU, an AP, a DSP, or the like.

The main storage device 1220 is a storage place that may receive a program or data from the auxiliary storage device 1230 and execute the program or the data when the program is executed. The main storage device 1220 retains the stored content even in power off, and may include the semiconductor device according to the above-described embodiment. The main storage device 1220 may include a 3D semiconductor device having a lateral channel structure in which an active region is supported by a line-shaped common source region.

The main storage device 1220 according to the embodiment may further include an SRAM or a DRAM of a volatile memory type in which all contents are erased in power off. Alternatively, the main storage device 1220 may not include the semiconductor device according to the embodiment but may include an SRAM or a DRAM of a volatile memory type in which all contents are erased in power off.

The auxiliary storage device 1230 is a storage device that may store a program code or data. The auxiliary storage device 1230 may have a lower data processing rate than that of the main storage device 1220, but may store a large amount of data and include the semiconductor device according to the above-described embodiment. The auxiliary storage unit 1230 may also include a 3D semiconductor device having a lateral channel structure in which an active region is supported by a line-shaped common source region.

An area of the auxiliary storage device 1230 according to the embodiment may be reduced, to reduce a size of the system 1200 and increase portability of the system 1200. Further, the auxiliary storage device 1230 may further include a data storage system (not shown), such as a magnetic tape or a magnetic disc using a magnetism, a laser disc using light, a magneto-optical disc using a magnetism and light, an SSD, a USB memory, a SD card, a mSD card, a micro SD card, a SDHC card, a memory stick card, a SM card, a MMC, an eMMC, or a CF card. Alternatively, the auxiliary storage device 1230 may not include the semiconductor device according to the above-described embodiment but may include a data storage system (not shown), such as a magnetic tape or a magnetic disc using a magnetism, a laser disc using light, a magneto-optical disc using a magnetism and light, an SSD, a USB memory, a SD card, a mSD card, a micro SD card, a SDHC card, a memory stick card, a SM card, a MMC, an eMMC, or a CF card.

The interface device 1240 may exchange a command and data of an external apparatus with the system of the embodiment, and may be a keypad, a keyboard, a mouse, a speaker, a microphone, a display, a variety of Human Interface Devices (HIDs), or a communication device. The communication device may include all modules such as a module coupled to a wired network and a module coupled to a wireless network. The wired network module may include a LAN, a USB, Ethernet, a PLC, or the like, and the wireless network module may include IrDA, CDMA, TDMA, FDMA, a wireless LAN, Zigbee, a USN, Bluetooth, RFID, LTE, NFC, Wibro, HSDPA, WCDMA, UWB, or the like.

The above embodiment of the present invention is illustrative and not limitative. Various alternatives and equivalents are possible. The Invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A three-dimensional (3D) semiconductor device, comprising:
a semiconductor substrate;
a common source region formed on the semiconductor substrate and extending in a line shape;
an active region formed on the common source region and including a lateral channel region, which is substantially in parallel to a surface of the semiconductor substrate, and source and drain regions that are branched from the lateral channel region to a direction substantially perpendicular to the surface of the semiconductor substrate; and
a gate formed in a space between the source region and the drain region.

2. The 3D semiconductor device of claim 1, wherein the source region is located in a region corresponding to the common source region.

3. The 3D semiconductor device of claim 1, wherein the active region is formed in a form in which a pair of drain regions share one source region.

4. The 3D semiconductor device of claim 1, further comprising a gate insulating layer covered between the source region and the gate, between the drain region and the gate, between the lateral channel region and the gate, and between the semiconductor substrate and the gate.

5. The 3D semiconductor device of claim 1, wherein the gate extends substantially in parallel to the common source region.

6. The 3D semiconductor device of claim 5, wherein the gate on the active region is located in a lower portion of a space between the source region and the drain region, and
a gate protection layer is further formed on the gate.

7. The 3D semiconductor device of claim 1, further comprising:
heating electrodes formed on the source region and the drain region; and
resistance variable material layers formed on the heating electrodes,
wherein the resistance variable material layer on the drain region is electrically coupled to the heating electrode therebelow, and
the resistance variable material layer on the source region is electrically isolated from the heating electrode therebelow.

8. The 3D semiconductor device of claim 7, further comprising:
a spacer formed on a sidewall of the resistance variable material layer on the drain region; and
a spacer insulating layer located on a sidewall of the resistance variable material layer on the source region, and between the resistance variable material layer on the source region and the heating electrode below the resistance variable material layer.

9. The 3D semiconductor device of claim 1, wherein the active region is coupled to the common source region.

10. The 3D semiconductor device of claim 1, wherein the common source region includes a semiconductor layer having different etch selectivity from that of each of semiconductor layers of the semiconductor substrate and the active region.

11. The 3D semiconductor device of claim 10, wherein the semiconductor substrate and the active region include a silicon material, and the common source region includes a silicon germanium material.

12. A method of manufacturing a three-dimensional (3D) semiconductor device, comprising:
forming a line-shaped common source region on a semiconductor substrate;
forming an active region including a lateral channel region substantially in parallel to a surface of the semiconductor substrate and source and drain regions branched from the lateral channel region to a direction substantially perpendicular to the surface of the semiconductor substrate, on the line-shaped common source region; and
forming a gate in a space between the source region and the drain region.

13. The method of claim 12, wherein the forming of the line-shaped common source region and the forming of the active region includes:
sequentially stacking a first semiconductor layer and a second semiconductor layer having different etch selectivity from that of the first semiconductor layer on the semiconductor substrate;
forming a hard mask pattern of which a protrusion is formed in a common source formation region on the second semiconductor layer;
etching the second and first semiconductor layers in a form of the hard mask pattern to define an active pattern;
selectively etching a predetermined portion of the first semiconductor layer other than a portion of the first semiconductor layer corresponding to the common source formation region through a sidewall of the active pattern to form the line-shaped common source region; and
etching partial portions of the active pattern at both sides of the protrusion of the hard mask pattern by a predetermined thickness to form gate formation regions,
wherein the source and drain regions are defined in the active pattern at both sides of each of the gate formation regions.

14. The method of claim 13, wherein the forming of the gate includes:
oxidizing a surface of each of the gate formation regions;
burying a conductive layer in each of the gate formation regions; and
over-etching the conductive layer.

15. The method of claim 12, further comprising: after the forming of the gate,
forming heating electrodes on the source and drain regions;
shielding the heating electrode on the source region and selectively opening the heating electrode on the drain region; and
forming resistance variable material layers on the heating electrodes.

16. The method of claim 15, wherein the forming of the heating electrodes includes:
recessing the source region and the drain region by a predetermined thickness to define variable resistor formation regions;
depositing a conductive material to fill the variable resistor formation regions; and
recessing the conductive material.

17. The method of claim 16, wherein the shielding of the heating electrode on the source region and the selectively opening of the heating electrode on the drain region includes:

depositing a spacer insulating layer in the variable resistor formation regions in which the heating electrodes are formed; and etching the spacer insulating layer in a state in which the spacer insulating layer on the source region is shielded to form a spacer exposing the heating electrode on the drain region.

\* \* \* \* \*